US012669677B2

(12) United States Patent　　　　　(10) Patent No.:　　US 12,669,677 B2
Moradian et al.　　　　　　　　　　　　(45) Date of Patent:　　　　Jun. 30, 2026

(54) APPARATUS AND METHODS FOR HEATING TUNABILITY IN PROCESSING CHAMBERS

(71) Applicant: Applied Materials, Inc., Santa Clara, CA (US)

(72) Inventors: Ala Moradian, Sunnyvale, CA (US); Saurabh Chopra, Santa Clara, CA (US); Lori D. Washington, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 478 days.

(21) Appl. No.: 18/159,214

(22) Filed: Jan. 25, 2023

(65) Prior Publication Data

US 2024/0248282 A1　　　Jul. 25, 2024

(51) Int. Cl.
　　*G02B 7/28*　　　　　(2021.01)
　　*G01J 5/10*　　　　　(2006.01)
　　　　　　　(Continued)

(52) U.S. Cl.
　　CPC .................. *G02B 7/28* (2013.01); *G01J 5/10* (2013.01); *G02B 26/02* (2013.01); (Continued)

(58) Field of Classification Search
None
See application file for complete search history.

(56) References Cited

U.S. PATENT DOCUMENTS

2002/0017618 A1*　2/2002　Gat ........................... F27B 5/04
　　　　　　　　　　　　　　　　　　　250/492.2
2006/0018639 A1*　1/2006　Ramamurthy .... H01L 21/67103
　　　　　　　　　　　　　　　　　　　392/416
(Continued)

FOREIGN PATENT DOCUMENTS

KR　　1020010089787 A　　10/2001
KR　　　100787468 B1　　12/2007
(Continued)

OTHER PUBLICATIONS

International Search Report/ Written Opinion issued to PCT/US2023/035493 on Feb. 14, 2024.
(Continued)

*Primary Examiner* — Ryan Crockett
(74) *Attorney, Agent, or Firm* — Patterson + Sheridan, LLP

(57)　　　　　　ABSTRACT

Embodiments herein are generally directed to electronic device manufacturing and, more particularly, to systems and methods for lamp heating in thermal processing chambers. In one embodiment, a substrate processing chamber includes a lid, a floor, and a processing volume between the lid and the floor. An upper window is disposed between the lid and the processing volume, a lower window is disposed between the floor and the processing volume. A lamp head is disposed between the lower window and the floor or between the upper window and the lid. At least one lamp is disposed within the lamp head, and a lens is disposed between the lamp head and the processing volume. In another embodi-
(Continued)

ment, a plurality of lamps is disposed within the lamp head including at least one first lamp operating at a first wavelength and at least one second lamp operating at a second wavelength.

22 Claims, 25 Drawing Sheets

(51) Int. Cl.

| | |
|---|---|
| *G02B 3/00* | (2006.01) |
| *G02B 3/08* | (2006.01) |
| *G02B 3/14* | (2006.01) |
| *G02B 26/00* | (2006.01) |
| *G02B 26/02* | (2006.01) |
| *G02B 26/08* | (2006.01) |
| *H10P 72/00* | (2026.01) |

(52) U.S. Cl.
CPC ........ *H10P 72/0436* (2026.01); *G02B 3/0087* (2013.01); *G02B 3/08* (2013.01); *G02B 3/14* (2013.01); *G02B 26/004* (2013.01); *G02B 26/0875* (2013.01)

(56) References Cited

U.S. PATENT DOCUMENTS

| | | | | |
|---|---|---|---|---|
| 2006/0092313 | A1* | 5/2006 | Kimura | .................... G02B 7/28 |
| | | | | 348/345 |
| 2013/0287376 | A1* | 10/2013 | Lim | .................. H01L 21/67115 |
| | | | | 392/419 |
| 2014/0199785 | A1* | 7/2014 | Ranish | ................ C23C 16/4583 |
| | | | | 118/712 |
| 2015/0146051 | A1* | 5/2015 | Abe | ........................ G03B 19/12 |
| | | | | 348/262 |
| 2020/0221017 | A1* | 7/2020 | Wada | .................... H04N 23/67 |
| 2022/0013376 | A1* | 1/2022 | Lau | ................... H01L 21/67115 |
| 2022/0353956 | A1* | 11/2022 | Olsen | ............... H01L 21/67248 |

FOREIGN PATENT DOCUMENTS

| | | |
|---|---|---|
| KR | 10-2022-0119138 A | 8/2022 |
| KR | 1020220140045 A | 10/2022 |

OTHER PUBLICATIONS

Korean Office Action for Application No. 10-2025-7027163 dated Mar. 12, 2026.

* cited by examiner

*Fig.* 7A
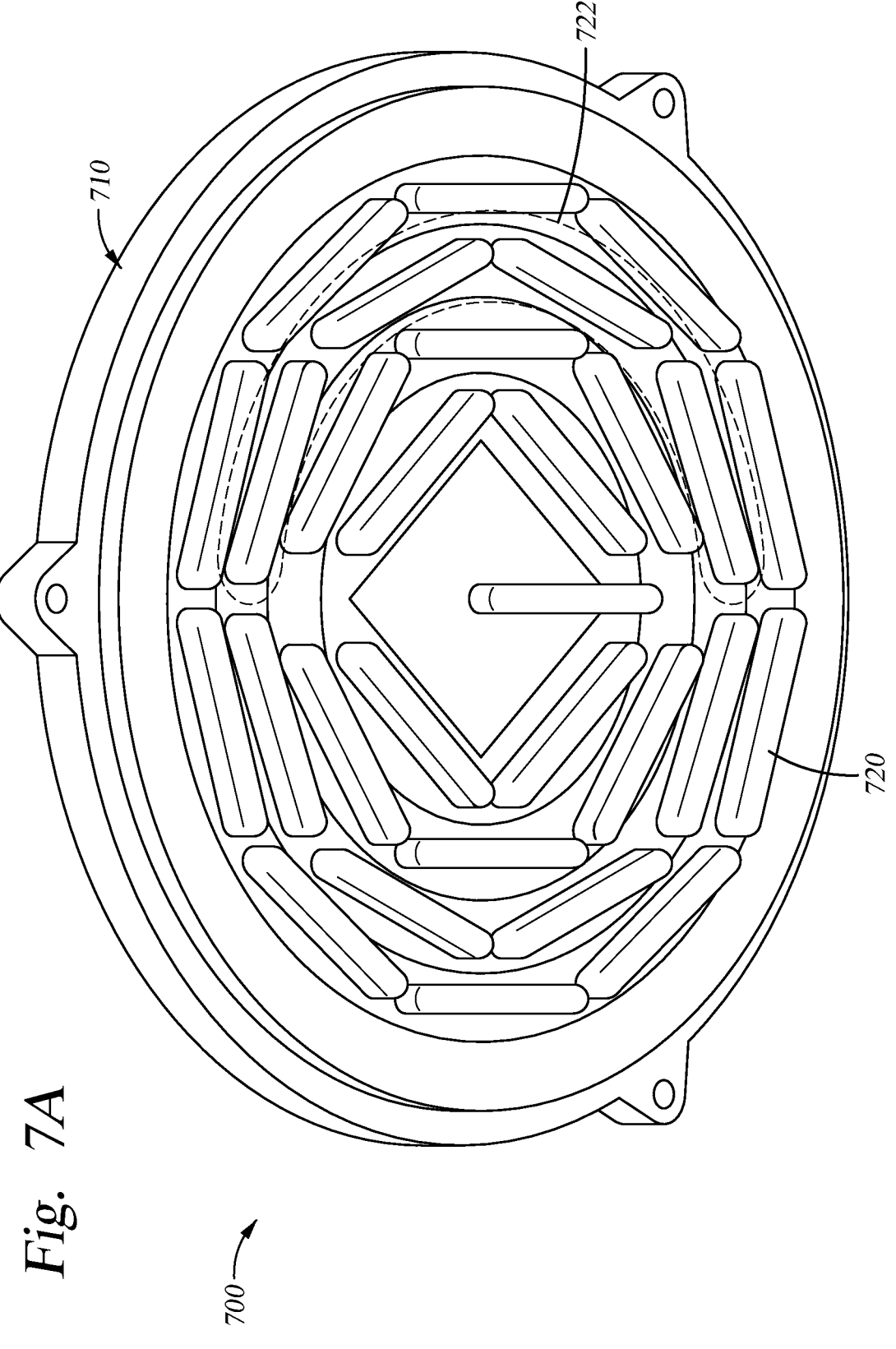

APPARATUS AND METHODS FOR HEATING TUNABILITY IN PROCESSING CHAMBERS

BACKGROUND

Field

Embodiments of the present disclosure generally relate to systems and methods for use in thermal processing chambers, such as semiconductor processing chambers. In particular, embodiments include apparatus and methods for lamp heating in thermal processing chambers.

Description of the Related Art

Processing chambers, such as Epitaxial deposition (EPI) and rapid thermal processing (RTP) chambers, are employed in semiconductor chip fabrication to create or chemically alter semiconductor substrates. Such processing chambers typically depend upon an array of high-intensity incandescent lamps fit into a lamp head and directed at the substrate. The lamps are electrically powered and can be very quickly turned on and off and a substantial fraction of their radiation can be directed to the substrate. As a result, the substrate can be very quickly heated without substantially heating the chamber and can be nearly as quickly cooled once the power is removed from the lamps. However, controlling the heating of a substrate in current thermal processing chambers is limited to adjusting the kilowatt power to the lamps.

Accordingly, there is a need for an improved thermal process chamber in semiconductor processing.

SUMMARY

Embodiments of the present disclosure generally relate to systems and methods for use in processing chambers, such as semiconductor processing chambers. More specifically, embodiments include apparatus and methods for lamp heating in thermal processing chambers.

In one embodiment, an adjustable reflector is provided. The adjustable reflector includes a plurality of reflector elements. Each of the plurality of elements as a first surface, a second surface, and a plurality of sidewalls. The first surface is a reflective surface and is configured to face a lamp. The adjustable reflector includes one or more actuation mechanisms coupled to the plurality of elements.

In another embodiment, a substrate processing chamber is provided. The substrate processing chamber includes a chamber body including a lid, a floor, and a processing volume between the lid and the floor. The substrate processing chamber also has an upper window between the lid and the processing volume, a lower window disposed between the floor and the processing volume. A substrate support is disposed in the processing volume and a lamp head positioned either below the lower window or above the upper window where at least one lamp disposed within the lamp head. Further, a reflector assembly is disposed on one side of the at least one lamp. The reflector assembly includes a plurality of elements, and one or more actuation mechanisms coupled to the plurality of elements, wherein a first surface of each of the plurality of elements is a reflective surface.

In yet another embodiment, a method of thermally processing a substrate is provided. The method includes measuring a thermal intensity of a thermal profile of an area of a substrate under or over a lamp and a reflector assembly having a plurality of elements, determining if the thermal intensity is outside of desired parameters, and in response to the thermal intensity being outside of desired parameters, adjusting the reflector profile of the reflector assembly along a centerline path using an actuation mechanism coupled to the reflector assembly.

In an embodiment, an adjustable reflector assembly is provided. The adjustable reflector assembly includes a plurality of elements including at least one stationary element and at least one rotating element, wherein a first surface of each of the plurality of elements is a reflective surface, and at least one actuation mechanism configured to actuate the at least one rotating element relative to the stationary element.

In another embodiment, a substrate processing chamber is provided. The substrate processing chamber includes a chamber body including a lid, a floor, and a processing volume between the lid and the floor. An upper window is disposed between the lid and the processing volume, and a lower window is disposed between the floor and the processing volume. A substrate support assembly disposed in the processing volume along with a lamp head positioned either below the lower window or above the upper window. At least one lamp is disposed within the lamp head, and a reflector assembly disposed on one side of the at least one lamp. The reflector assembly includes a plurality of elements, wherein at least one of the plurality of elements is a stationary element and at least one of the plurality of elements is a rotating element.

In yet another embodiment, a method of processing a substrate is provided. The method includes measuring a thermal intensity of a thermal profile of an area of a substrate under a lamp and a reflector assembly having a stationary element and a plurality of rotating elements, wherein a first surface of the stationary element and plurality of rotating elements create a reflector profile, determining if the thermal intensity is outside of desired parameters, and in response to the thermal intensity being outside of desired parameters, adjusting the reflector profile of the reflector assembly using an actuation mechanism coupled to the reflector assembly.

In an embodiment, a substrate processing chamber is provided. The substrate processing chamber includes a chamber body including a lid, a floor, and a processing volume disposed between the lid and the floor. An upper window is disposed between the lid and the processing volume and a lower window is disposed between the floor and the processing volume. A substrate support assembly is disposed in the processing volume along with a lamp head disposed either between the upper window and the lid or between the lower window and the floor. At least one lamp is disposed within the lamp head, and a lens is disposed between the lamp head and the processing volume.

In another embodiment, a substrate processing chamber is provided. The substrate processing chamber includes a chamber body includes a lid, a floor, and a processing volume between the lid and the floor. An upper window is disposed between the lid and the processing volume, a lower window is disposed between the floor and the processing volume, a substrate support assembly is disposed in the processing volume. A lamp head is disposed between the lower window and the floor or between the upper window and the lid. A plurality of lamps is disposed within the lamp head where the plurality of lamps includes at least one first lamp operating at a first wavelength and at least one second lamp operating at a second wavelength different than the first wavelength.

In yet another embodiment, a method of heating a substrate is provided. The method includes measuring a thermal intensity of a thermal profile of an area of a substrate on a substrate support near a lamp and a lens between the lamp and the substrate support, determining if the thermal intensity is outside of desired parameters, and in response to the thermal intensity being outside of desired parameters, adjusting a focal length of a lens assembly using an actuation mechanism coupled to the lens assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 7A illustrates an axonometric view of a lamp head according to an embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein are generally directed to a processing chamber and, more particularly, to systems and methods for controlling or tuning the radiated heat from lamps in a thermal processing chamber directed toward a substrate.

In the present disclosure, a thermal processing chamber for epitaxial processes is provided to control the radiation from lamps of a lamp head. In certain embodiments, a reflector assembly is used to control the focal length of reflected radiation from the lamp head toward a substrate in the thermal processing chamber. In other embodiments, a lens is used to control the focal length of radiation directed toward the substrate from the lamp head. Additionally, the lamps within the lamp head operate at different peak wavelengths to control the radiation emitted toward the substrate.

Figure 1:
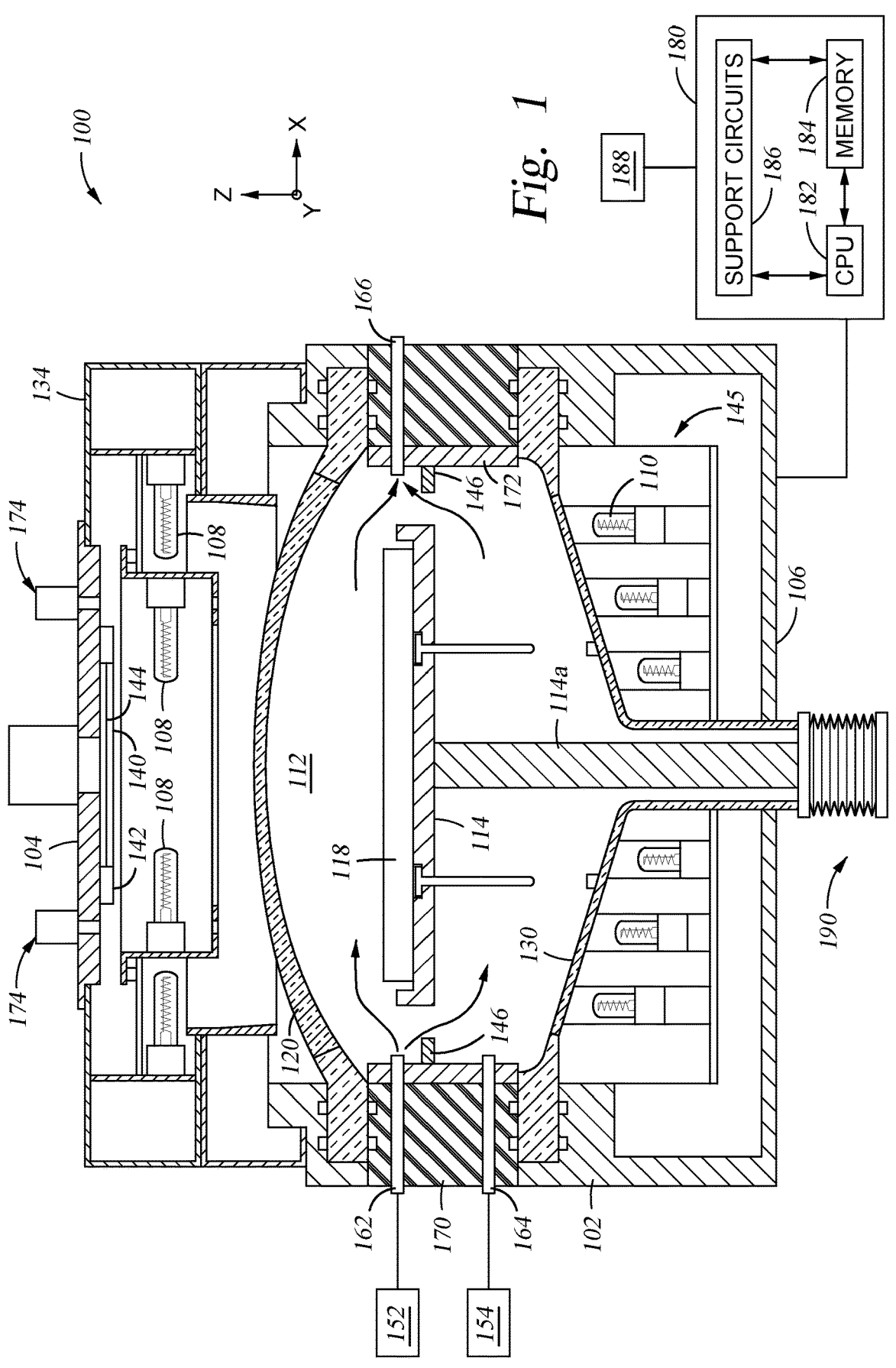
FIG. 1 is a schematic cross-sectional side view of a processing apparatus according to one implementation

FIG. 1 is a schematic cross sectional side view of a process chamber 100 according to one embodiment. The process chamber 100 is a process chamber for performing a thermal process, such as an epitaxial deposition process. The process chamber 100 includes a chamber lid 104, a chamber body 102, a chamber floor 106, a cover 134, a processing volume 112, and arrays of radiant heating lamps 108, 110 for heating, and a susceptor 114 disposed within the process chamber 100. The arrays of radiant heating lamps 108, 110 are disposed above and below the susceptor 114, although one of the array of upper radiant heating lamps 108 or array of lower radiant heating lamps 110 may be omitted.

The arrays of radiant heating lamps 108, 110 may be independently controlled in zones in order to control the temperature of various regions of the substrate 118 as process gas passes thereover, thus facilitating the deposition of a material onto the upper surface of the substrate 118. The upper lamps 108 and the lower lamps 110 may include bulbs configured to heat the substrate 118 to a temperature within a range of about 200 degrees C. to about 1600 degrees C. Each of the upper lamps 108 and the lower lamps 110 is coupled to a power distribution board (not shown) through which power is supplied to each of the upper lamps 108 and the lower lamps 110. The upper lamps 108 and the lower lamps 110 are positioned within a lamp head 145 which may be cooled during or after processing by, for example, a cooling fluid introduced into channels (not shown) located between the upper lamps 108 and/or the lower lamps 110. The lamp head 116 conductively and radiatively cools the lower window 130 due in part to the close proximity of the lamp head 116 to the lower window 130. The lamp head 116 may also cool the lamp walls and walls of reflectors 140 around the lamps. Alternatively, the lower window 130 may be cooled by a convective approach.

The susceptor 114 is a disk-like substrate support as shown, but may alternatively include a ring-like substrate support, which supports the substrate 118 from the edge of the substrate 118, exposing a backside of the substrate 118 to heat from the lower radiant heating lamps 110. The susceptor 114 is formed from silicon carbide or graphite coated with silicon carbide to absorb radiant energy from the radiant heating lamps 108, 110 and conduct the radiant energy to the substrate 118, to facilitate heating the substrate 118.

The susceptor 114 is located within the process chamber 100 between an upper window 120, and a lower window 130. Each of the upper window 120 and the lower window 130 are shaped as domes. However, it is contemplated that the upper window 120 and the lower window 130 may have other shapes, including planar. A base ring 170 is disposed between the upper window 120 and the lower window 130. Each of the upper window 120 and the lower window 130 is optically transparent to radiant energy provided by the arrays of radiant heating lamps 108, 110. The upper window 120 is disposed between the chamber lid 104 and the susceptor 114. The upper radiant heating lamps 108 are disposed above the first window 120. One or more reflectors 140 facilitates directing of thermal energy from the upper radiant heating lamps 108 to an upper surface of the substrate 118. Similarly, the lower radiant heating lamps 110 are disposed below the second window 130 and may also include one or more reflectors 140 positioned to direct thermal energy from the lower radiant heating lamps 110 to a lower surface of the substrate 118.

The susceptor 114 includes a shaft or stem 114a that is coupled to a motion assembly 190. The motion assembly 190 includes one or more actuators or adjustment devices that provide movement or adjustment or rotation of the stem 114a or the susceptor 114. The susceptor 114 may rotate at between about 5 RPM and about 100 RPM, for example, between about 10 RPM and about 50 RPM. A process gas inlet 162, a purge gas inlet 164, and a gas outlet 166 are provided in the base ring 170 to facilitate exposure of the substrate 118 to process gas during processing. A process gas source 152 provides a process gas to the process gas inlet 162, and a purge gas source 154 provides a purge gas to the purge gas inlet 164. The process and purge gases flow through the gas outlet 166 to an exhaust assembly (not shown).

The reflector 140 may be placed outside the upper window 120, the lower window 130, or both to reflect light that is radiating off the substrate 118 back onto the substrate 118. The reflector 140 may be secured above the upper window 120 using one or more clamp rings 142. Another reflector 140 may be secured below the lower window 130 using one or more additional clamp rings 142. The reflector 140 can be made of a metal such as aluminum, brass, or stainless steel. The efficiency of the reflection can be improved by coating a reflector area with a highly reflective coating such as gold. Alternatively, a mirror polish may be used to improve the reflectivity of the reflector. The reflector 140 can have one or more channels 144 connected to a cooling source (not shown). The channels 144 connect to a passage (not shown) formed on a side of the reflector 140 for cooling the reflector 140. The passage is configured to carry a flow of a cooling fluid, such as deionized water or a forced stream of gas such as air, and may run horizontally along the side of the reflector 140 in any desired pattern covering a portion or entire surface of the reflector 140.

The present disclosure contemplates that other lamps may be used (in addition to or in place of the lamps) for the various lamps described herein. For example, resistive heaters, light emitting diodes (LEDs), or lasers such as solid state vertical-cavity surface-emitting lasers (VCSELs) may be used for the various lamps described herein.

The upper and lower windows 120, 130 may be transparent to infrared radiation, such as by transmitting at least 95% of infrared radiation. The upper and lower windows 120, 130 may be a quartz material (such as a transparent quartz). Alternatively, the upper and lower windows may be sapphire.

A circular shield 146 is disposed around the susceptor 114 and coupled to the base ring 170 or a liner 172 to prevent or minimizes leakage of heat from the radiant heating lamps 108, 110. Substrate temperature may be indirectly measured by sensors configured to measure temperatures at the bottom of the susceptor 114. The sensors may be pyrometers disposed in ports formed in the lamp head 116. Additionally, one or more temperature sensors 174, such as a pyrometer, are directed to measure the temperature of the device side of the substrate 118. The one or more temperature sensors 174 are disposed through the chamber lid 104, and configured to detect the substrate 118.

The above-described process chamber 100 is controlled by a processor based system controller, such as a controller 180, which may be coupled to a user interface 188. For example, the controller 180 is configured to control pressure, temperatures, and flow rates within the process chamber 100. By way of further example, the controller 180 is configured to operate the upper and lower lamps and the reflector actuators (as further described below). The controller 180 includes a programmable central processing unit (CPU) 182 that is operable with a memory 184, support circuits 186, and a mass storage device, an input control unit, and a display unit (not shown), such as power supplies, clocks, cache, input/output (I/O) circuits, and the like, coupled to the various components of the process chamber 100 to facilitate control of the substrate processing. The controller 180 also includes hardware for monitoring substrate processing through sensors in the process chamber 100, including sensors monitoring the precursor, process gas and purge gas flow. Other sensors that measure system parameters such as substrate temperature, chamber atmosphere pressure and the like, may also provide information to the controller 180.

Figure 2A:
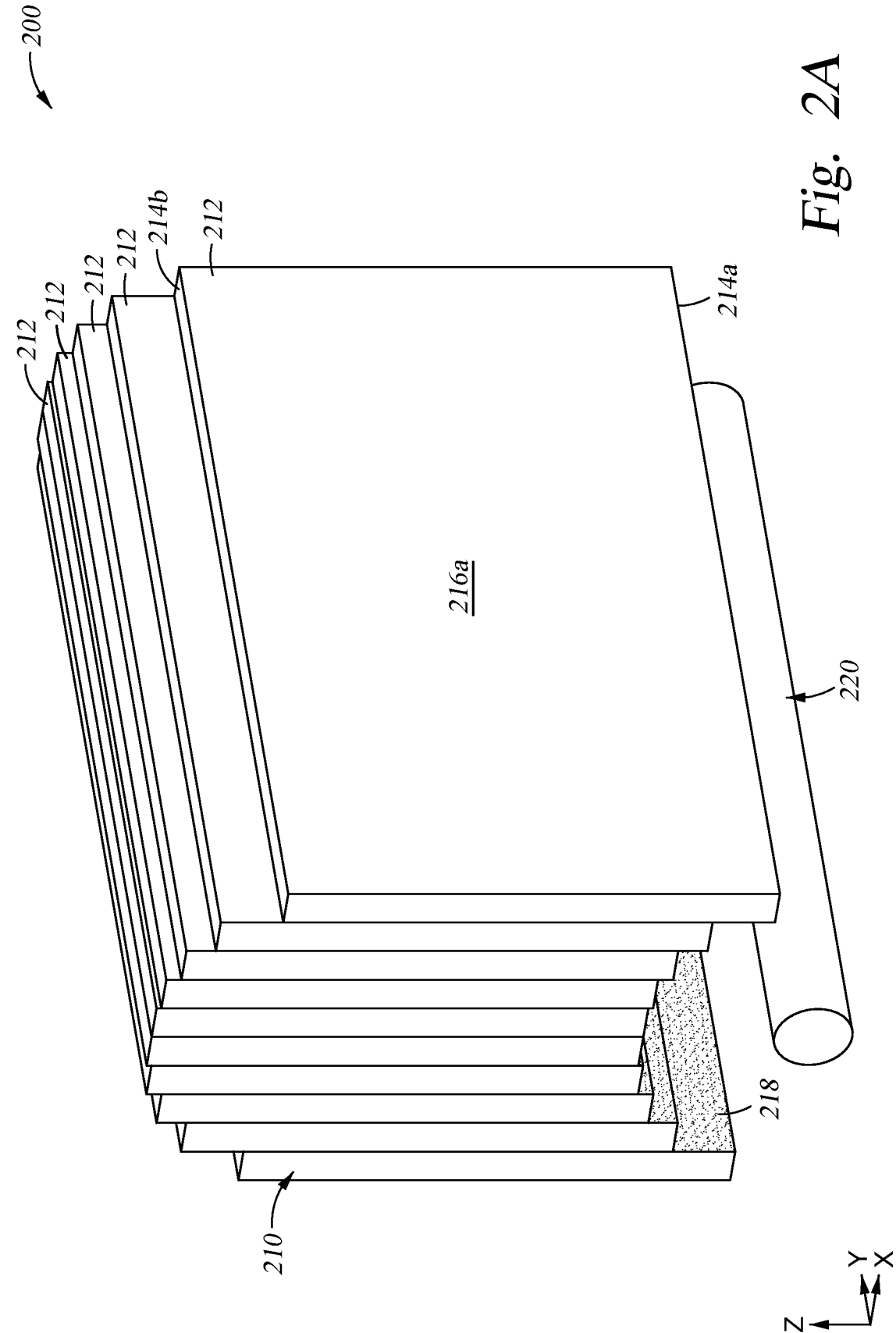
FIG. 2A illustrates a schematic axonometric view of a reflector assembly, according to one embodiment.

FIG. 2A illustrates a schematic axonometric view of a reflector assembly 200, such as the reflector 140, disposed over a lamp 220, such as one or more of the upper lamps 108. It should be noted that the reflector assembly 200 could also be disposed under the lamp 220, such as one or more of the lower lamps 110. As shown, the reflector assembly 200 includes a reflector 210 including a plurality of reflector elements 212. Each reflector element 212 has a first surface 214a which faces the lamp 220, a second surface 214b or top surface opposite the first surface 214a, and sidewalls 216 with sidewall surfaces 216a. Each reflector element may include a highly-polished or mirror-polished metal such as aluminum, brass or made out of a metal, polymer, or ceramic with a highly reflective coating 218 on the first surface 214a. The reflective coating 218, such as a gold or silver coating, may reflect a radiance of the lamp 220. Other surfaces may include the reflective coating 218, such as sidewall surfaces 216a that are exposed to the radiance from the lamp 220 when the plurality of elements 212 are actuated. A total reflective surface consists of all surfaces of the reflector 210 that have the reflective coating 218, including the first surface 214a and sidewall surfaces 216a of each of the plurality of elements 212.

Figures 2B, 2C, 2D:
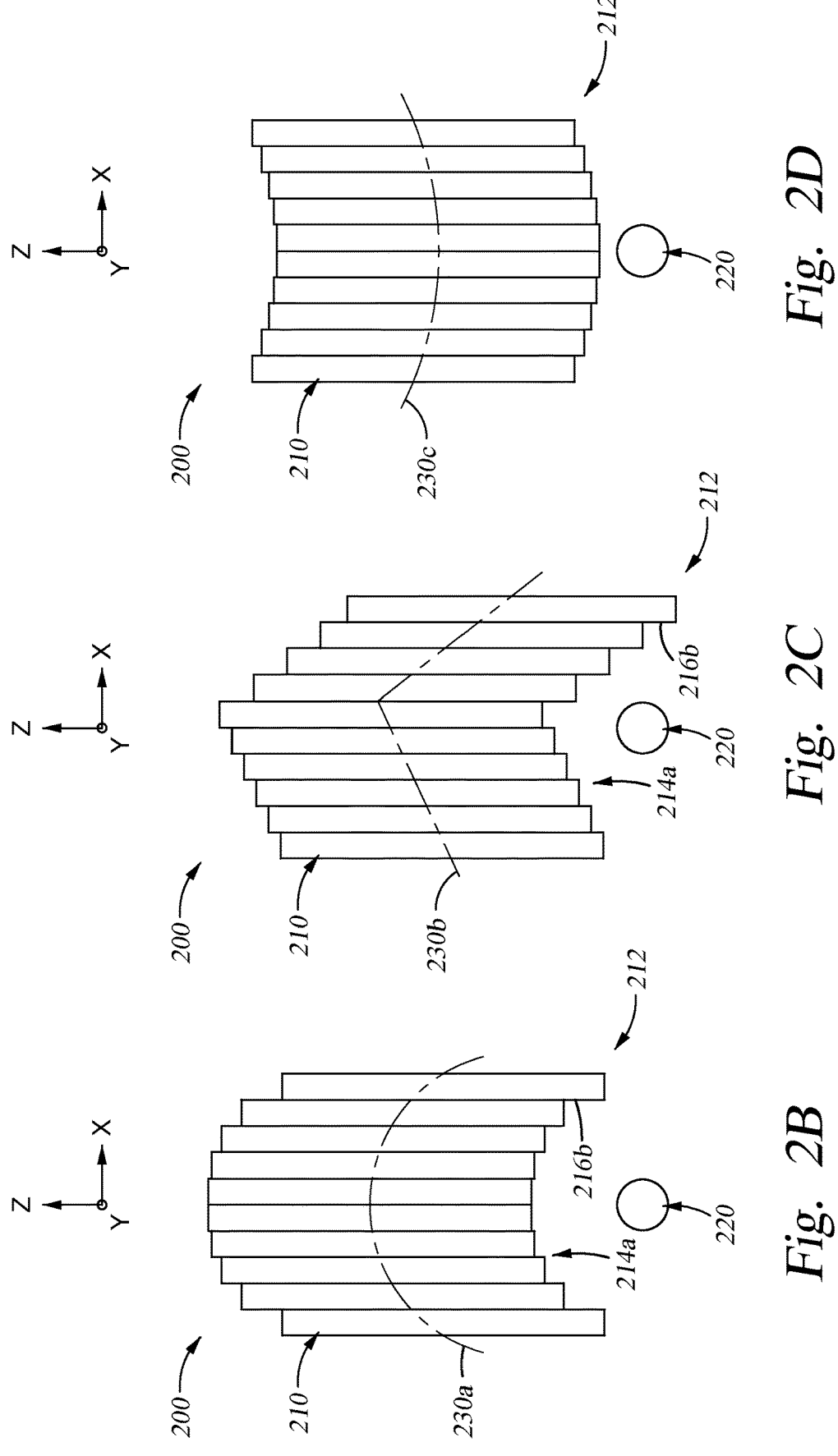
FIGS. 2B-2D illustrate a schematic front view of the reflector assembly shown in FIG. 2A, according to certain embodiments.

FIGS. 2B, 2C, and 2D are schematic front views of the reflector assembly 200 as shown in FIG. 2A. As shown in FIG. 2B, the plurality of elements 212 may be actuated to create a concave reflective surface by arranging a center point of each of the plurality of elements 212 along a concave centerline path 230*a*. As the center point of each plurality of elements 212 aligns with the concave centerline path 230*a*, the first surface 214*a* of each element is exposed to the lamp 220. Additionally, a portion of each inner sidewall 216*b* (i.e., a sidewall 216 facing the lamp 220) of each of the plurality of elements 212 is exposed to the lamp 220. These exposed inner sidewall 216*b* portions along with each first surface 214*a* create a reflector with a concave reflective surface.

As shown in FIG. 2C, each of the plurality of elements 212 may be arranged into an asymmetrically angled reflector by aligning the center point of each of the plurality of elements 212 along an asymmetrically angled centerline path 230*b*. As the centers of each of the plurality of elements 212 are aligned along the asymmetrically angled centerline path 230*b*, different portions of each of the inner sidewalls 216*b* are exposed to the lamp 220. These portions of the inner sidewalls 216*b*, along with the first surface 214*a* of each of the plurality of elements 212, creates an asymmetrically angled reflector according to desired specifications.

As shown in FIG. 2D, each of the plurality of elements 212 may be arranged into a convex reflector by aligning the center point of each of the plurality of elements 212 along a convex centerline path 230*c*. As the centers of each of the plurality of elements 212 align along the convex centerline path 230*c*, different portions of the inner sidewalls 216*b* of each of the plurality of elements 212 are exposed. These portions of the inner sidewalls 216*b*, along with the first surface 214 as of each of the plurality of elements 212, create a convex reflector.

Although specific centerline paths are described in FIGS. 2B-3D, any desired centerline path may be used according to desired specifications (e.g., a flat reflector, a slanted reflector) and may be tailored to specific recipes.

Aligning the reflector assembly along a desired centerline path allows the reflector to be tuned per recipe or in a closed-loop control system so that the power intensity or irradiance pattern, which heats the substrates, may be adjusted as needed. This allows a means to re-define a zone of the substrate, redistribute the irradiance for each zone, or a combination thereof.

Figure 3A:
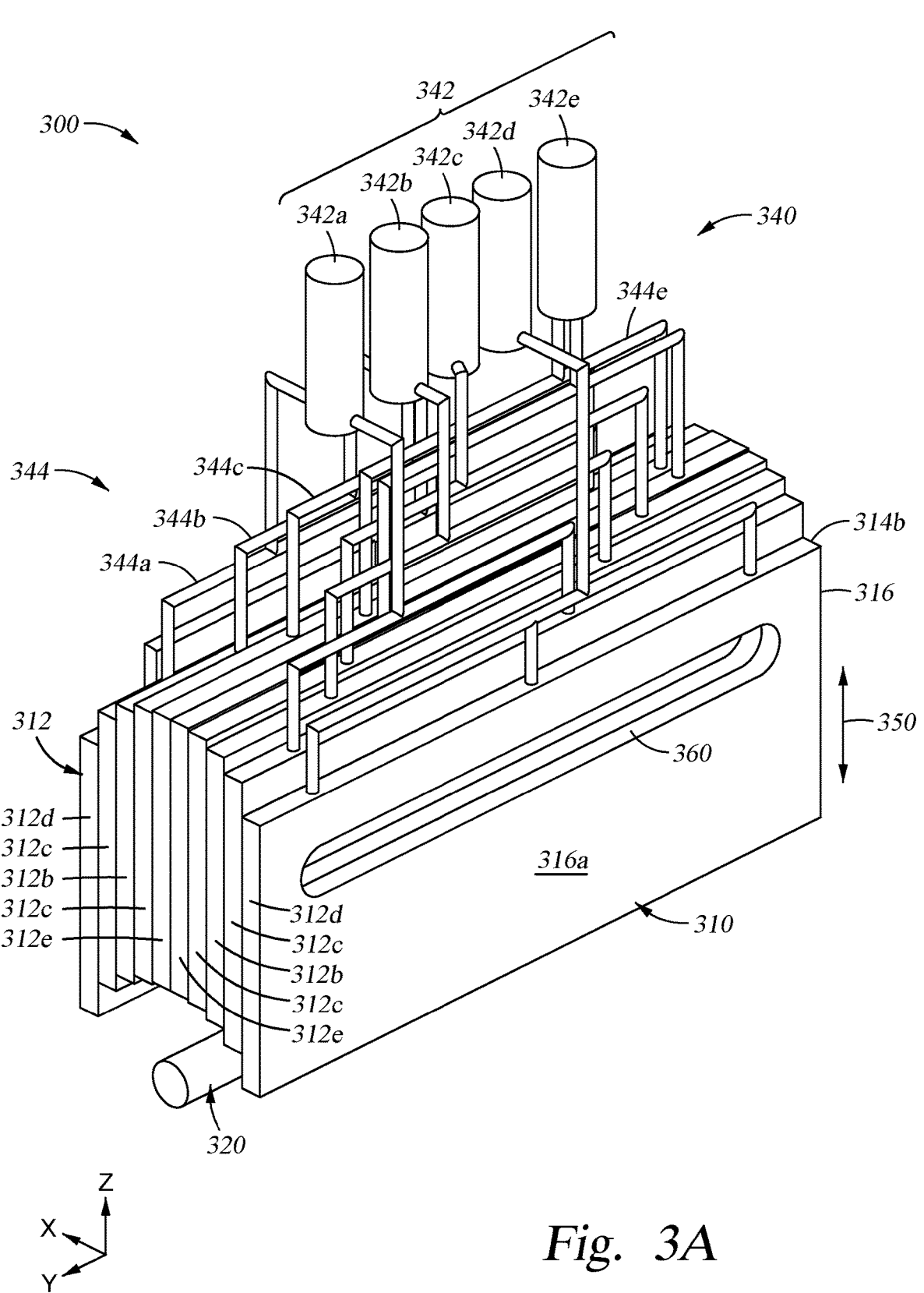
FIG. 3A illustrates a schematic axonometric view of a reflector assembly, according to an embodiment.
Figure 3B:
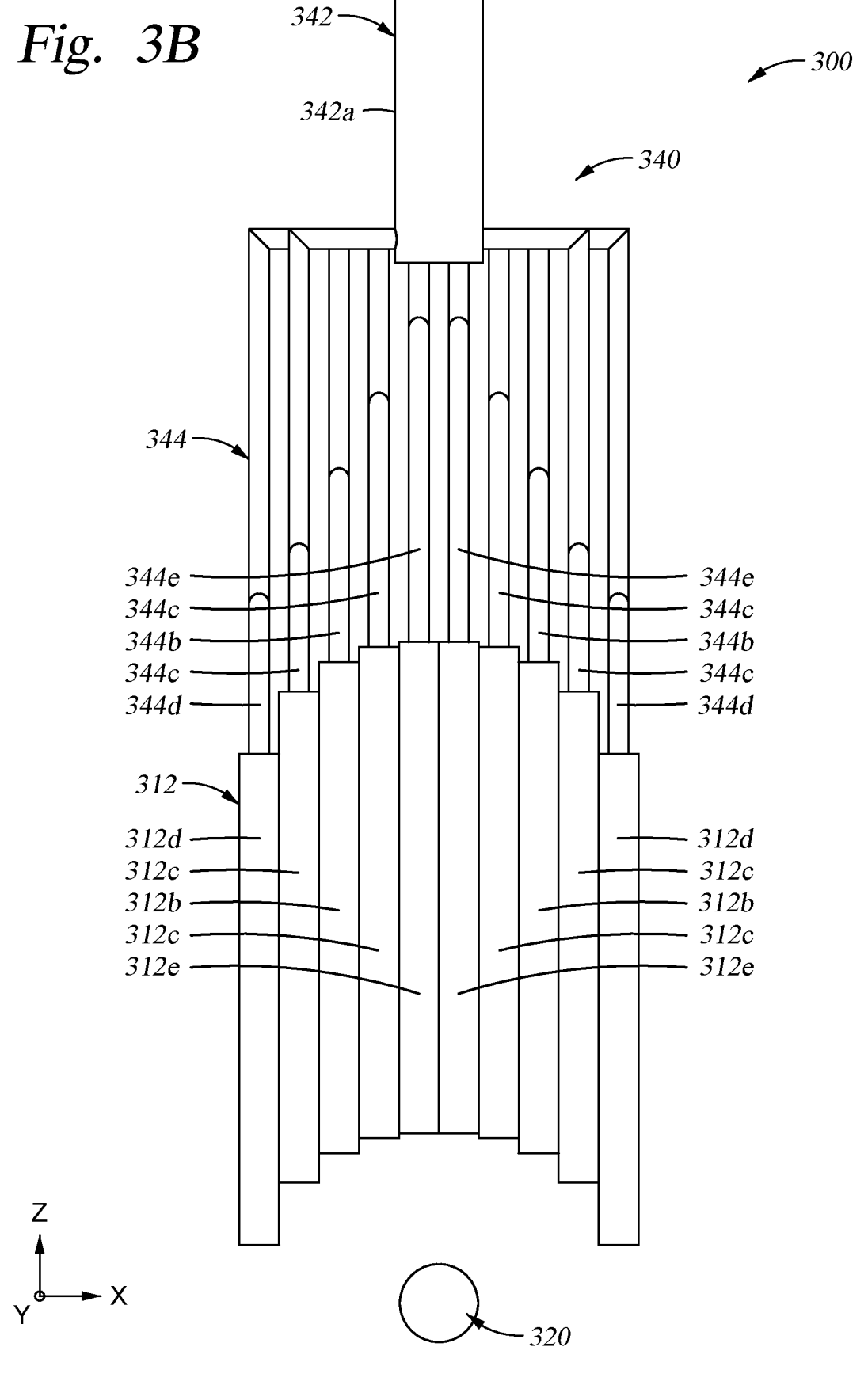
FIG. 3B illustrates a schematic front view of the reflector assembly shown in FIG. 3A, according to an embodiment.
Figure 3C:
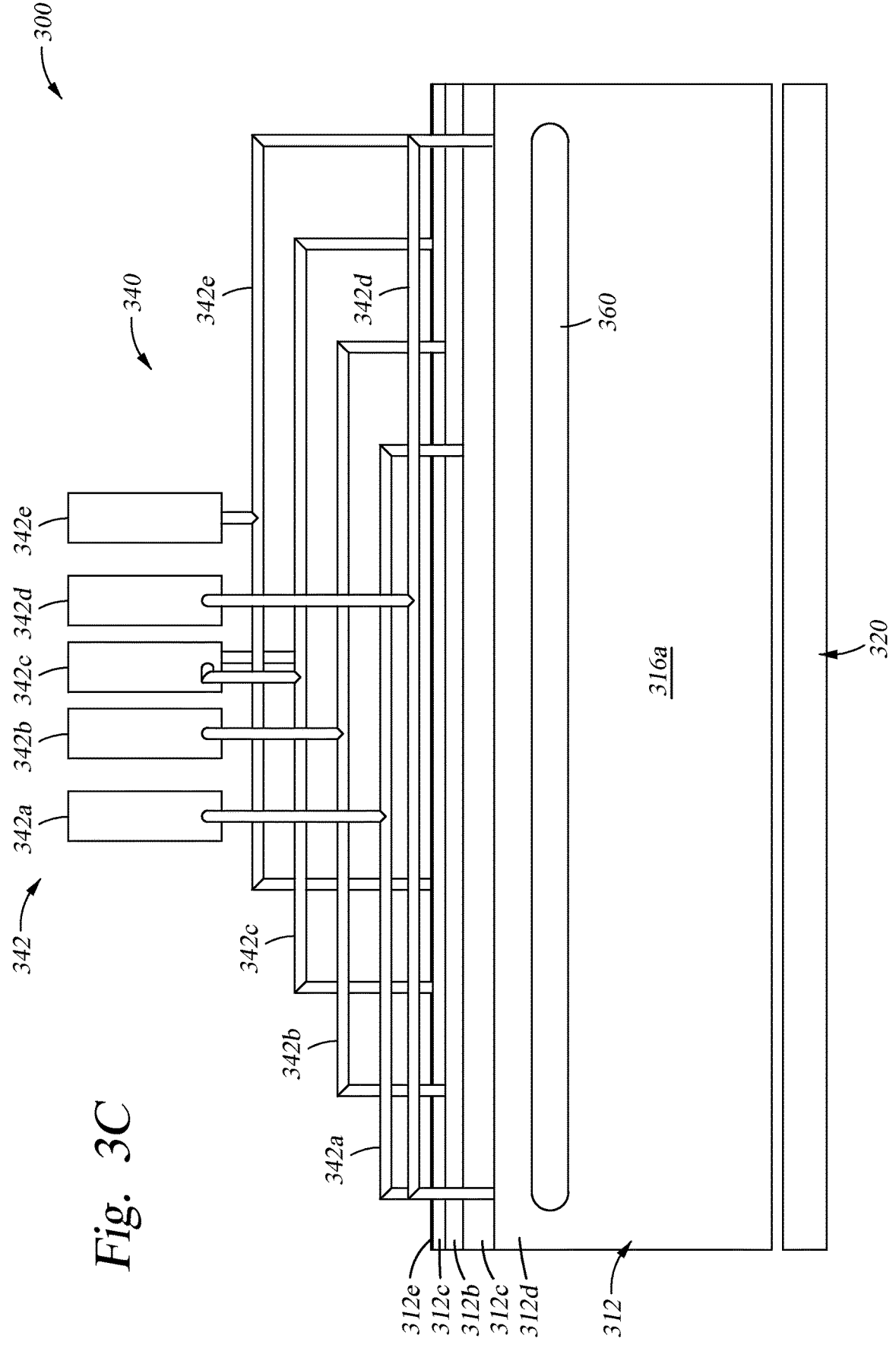
FIG. 3C illustrates a schematic side view of the reflector assembly shown in FIG. 3A, according to an embodiment.

FIG. 3A shows a schematic axonometric view of a reflector assembly 300. FIG. 3B shows a schematic front view, and FIG. 3C shows a schematic side view of the reflector assembly 300. The reflector assembly 400, similar to the reflector assembly 200 in FIG. 2A, comprises a reflector 310 having a plurality of reflector elements 312. Each reflector element 312 is stacked onto the other elements and each reflector element 312 has a first surface 314*a*, a second surface 314*b* opposite the first surface 314*a*, and a plurality of sidewalls 316. The first surface 314*a* is configured to face a lamp 320, such as an upper lamp 108 or a lower lamp 110. The first surface 314*a* has a reflective coating 318, such as a gold coating, that reflects the radiance of the lamp 320. The sidewalls 316 of each of the plurality of reflective elements 312 include inner sidewalls 316*b* that face the lamp 320. The inner sidewalls 316*b* of each of the plurality of elements 312 also have a reflective coating 318.

As shown in FIGS. 3A-3C, the reflector assembly 310 also includes an actuator assembly 340 configured to actuate each of the plurality of reflective elements 312 along a motion path 350 perpendicular or normal to a radiating surface of the lamp 320. The actuator assembly 340 may include a plurality of actuators 342, such as pneumatic actuators, and may be attached to each of the plurality of elements 312 through connectors 344. As shown in FIG. 3B, an actuator (e.g., actuators 342*a*-442*e*) may be connected to a pair of elements (e.g., pair of elements 312*a*-412*e*) of the plurality of elements 312 and configured to actuate the pair of elements 312*a*-312*e* in concert. When actuated, each pair elements 312*a*-312*e* slides with respect to adjacent elements (e.g., 312*d* slides against 312*a*). The actuator assembly 340 may then arrange the plurality of elements 312 along a centerline path as described in FIGS. 2B-2D (e.g., 230*a*, 230*b*, 230*c*, or other desired centerline path).

The reflector assembly 300 allows the reflector to reflect a radiance of the lamp 320 (e.g., upper lamp 108 or lower lamp 110) toward a target at a desired focal point. The target may be a portion of the substrate (e.g., substrate 118) in the processing chamber (e.g., the processing chamber 100). By actuating each of the elements of the reflector assembly 310, the focal point of the radiance from the lamp 320 may be adjusted as desired, such as prior to processing or during processing. The adjustability of the disclosed subject matter enables additional thermal tunability for multiple process recipes.

As shown in FIGS. 3A and 3C, the reflector assembly 300 may also include a cooling channel 360 through each of the elements. The cooling channel 360 comprises of at least one aperture 362 through the sidewalls 316 of each of the elements. Each of the apertures 362 may align during actuation of the plurality of elements 312 to create a continuous channel through the reflector assembly 310. The at least one aperture 362 may be any desired cross-sectional shape, such as rectangular, circular, triangular, or a combination thereof. In one embodiment, the at least one aperture 362 may have an oblong cross-sectional shape. The cooling channel 360 may be configured to allow a desired cooling fluid flow through the reflector assembly 310, such as water, refrigerant, or air. The cooling channel 360 allows the reflector assembly 310 to maintain a desired operating temperature during operation, even as the reflective coating 318 erodes through repeated use.

Figure 4:
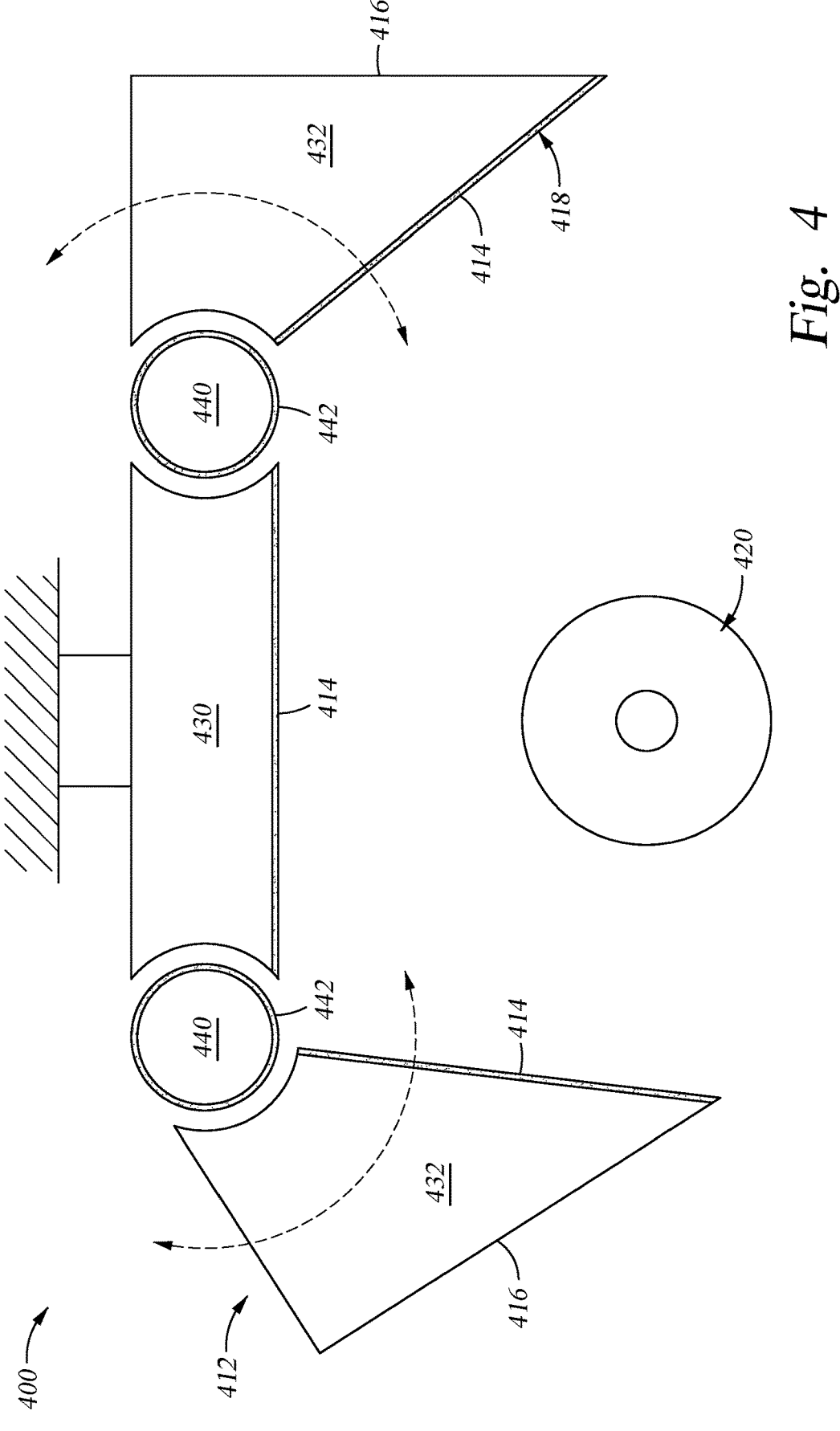
FIG. 4 illustrates a schematic front view of a reflector assembly according to an embodiment.

FIG. 4 illustrates a schematic front view of a reflector assembly 400. The reflector assembly 400 comprises a plurality of reflector elements 412. Each of the reflector elements 412 has a first surface 414 that faces a lamp 420, such as an upper lamp 108 or a lower lamp 110, and one or more sidewalls that do not face the lamp 420. The first surface 414 may have a reflective coating 418 configured to reflect a radiance of the lamp 420. The reflective coating 418 may comprise a gold or silver coating. Alternatively, the reflector elements 412 may include mirror polished metals such as aluminum or aluminum alloys that have optically transparent coatings that prevent surface oxidation.

At least one of the plurality of elements 412 is a stationary element 430 coupled to the remaining plurality of elements 412 (e.g., rotating elements 432). The stationary element 430 may have at plurality of actuators 440 coupled between the stationary element 430 and two rotating elements 432. The plurality of actuators 440 may be any suitable actuators 440 such as rotational motors like servo motors or pneumatic motors. The outer surface 442 of each of the plurality of actuators 440 may be coated in a reflective coating 418 similar to the reflective coating 418 of the first surfaces 414 of the plurality of elements 412. The first surfaces 414 of the plurality of elements 412 and the outer surface 442 of the plurality of actuators 440 form the reflector surface.

The reflector surface may be adjusted by actuating the rotating elements 432 relative to the stationary element 430 using the plurality of actuators 440. The reflector surface may then reflect the radiance of the lamp 420 towards a target, such as a portion of a substrate (e.g., substrate 118), at a focal point. The focal point of the reflector surface may be adjusted by actuating the rotating elements 432 as desired, such as prior to processing or during processing. The adjustability of the disclosed subject matter reduces overall cost and complexity of processing multiple types of substrates or recipes in a given processing chamber.

Optionally, the plurality of elements 412 may include at least one aperture extending through each of the plurality of elements to form a cooling channel (not shown) similar to cooling channel 360.

Figure 5A:
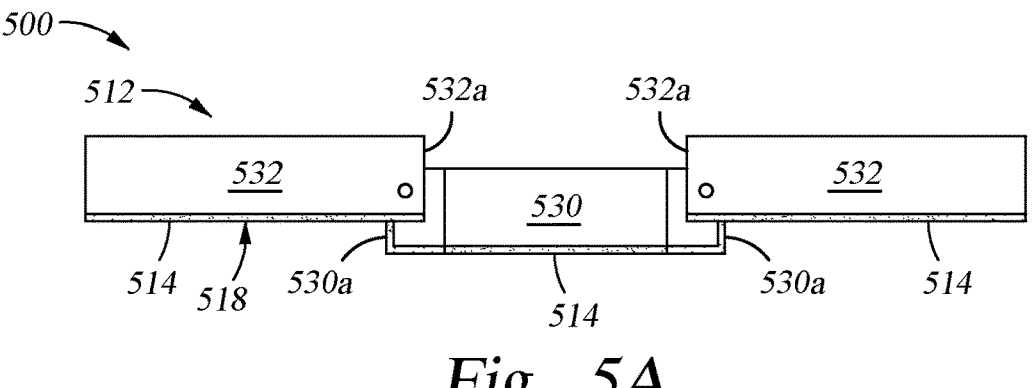
FIG. 5A illustrates a schematic front view of a reflector assembly according to an embodiment.
Figure 5B:
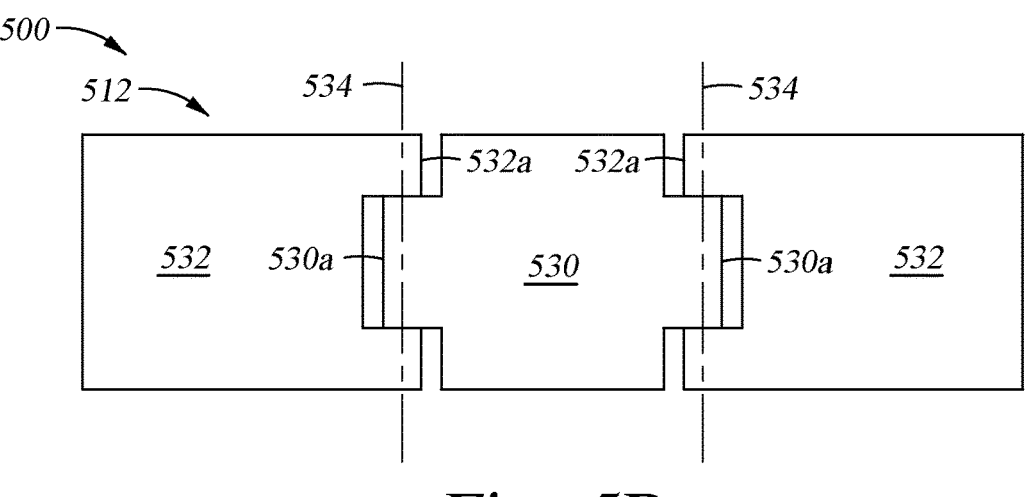
FIG. 5B illustrates a top view of the reflector assembly shown in FIG. 5A according to an embodiment.
Figure 5C:
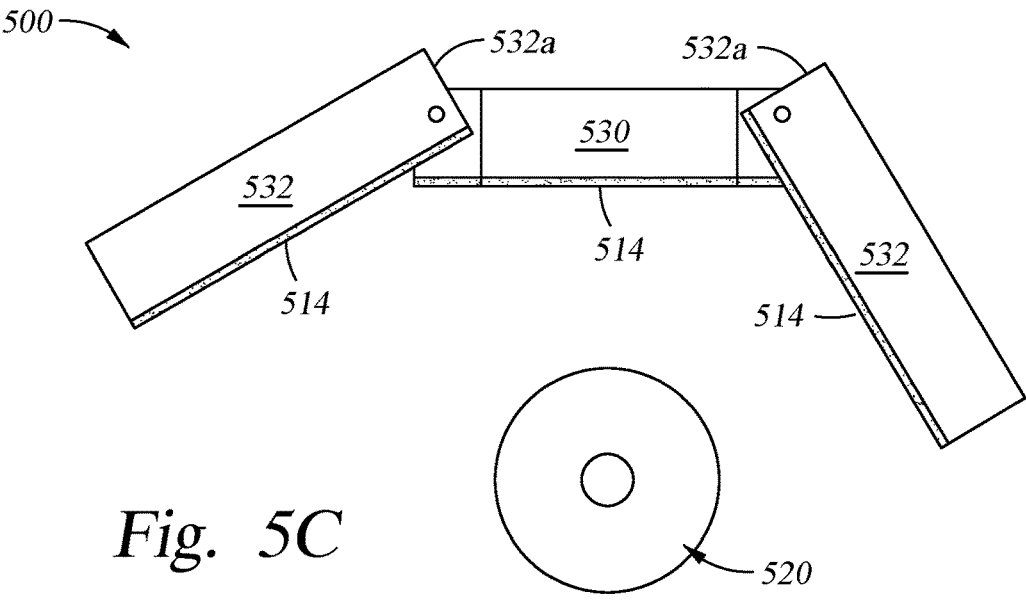
FIG. 5C illustrates a schematic front view of the reflector assembly shown in FIG. 5A, according to an embodiment.

FIG. 5A illustrates a schematic front view of a reflector assembly according to an embodiment. FIG. 5B illustrates a top view of the reflector assembly shown in FIG. 5A according to an embodiment. FIG. 5C illustrates a schematic front view of the reflector assembly shown in FIG. 5A, according to an embodiment. As shown in FIGS. 5A-5C, a reflector assembly 500 may be configured to have the plurality of actuators embedded within the plurality of elements 512. As shown in FIGS. 5A and 5B, inner edges 532a of rotating elements 532 may overlap and be axially coupled along a plurality of parallel axes 534 along opposing edges 530a of a stationary element 530. Each of the plurality of elements 512 have a reflective coating 518 on a first surface 514 that faces a lamp 520, such as an upper lamp 108 or a lower lamp 110. The plurality of elements 512 may be actuated to create a substantially flat and stepped reflector surface. As shown in FIG. 5C, the rotating elements 532 may be actuated to rotate along the plurality of parallel axes 534 as desired, such as before processing or during processing. Actuating the rotating elements 532 may then adjust a focal point of the reflected radiance of the lamp 520 towards a target, such as the substrate 118 in the processing chamber 100.

Figures 6A, 6B, 6C, 6D:
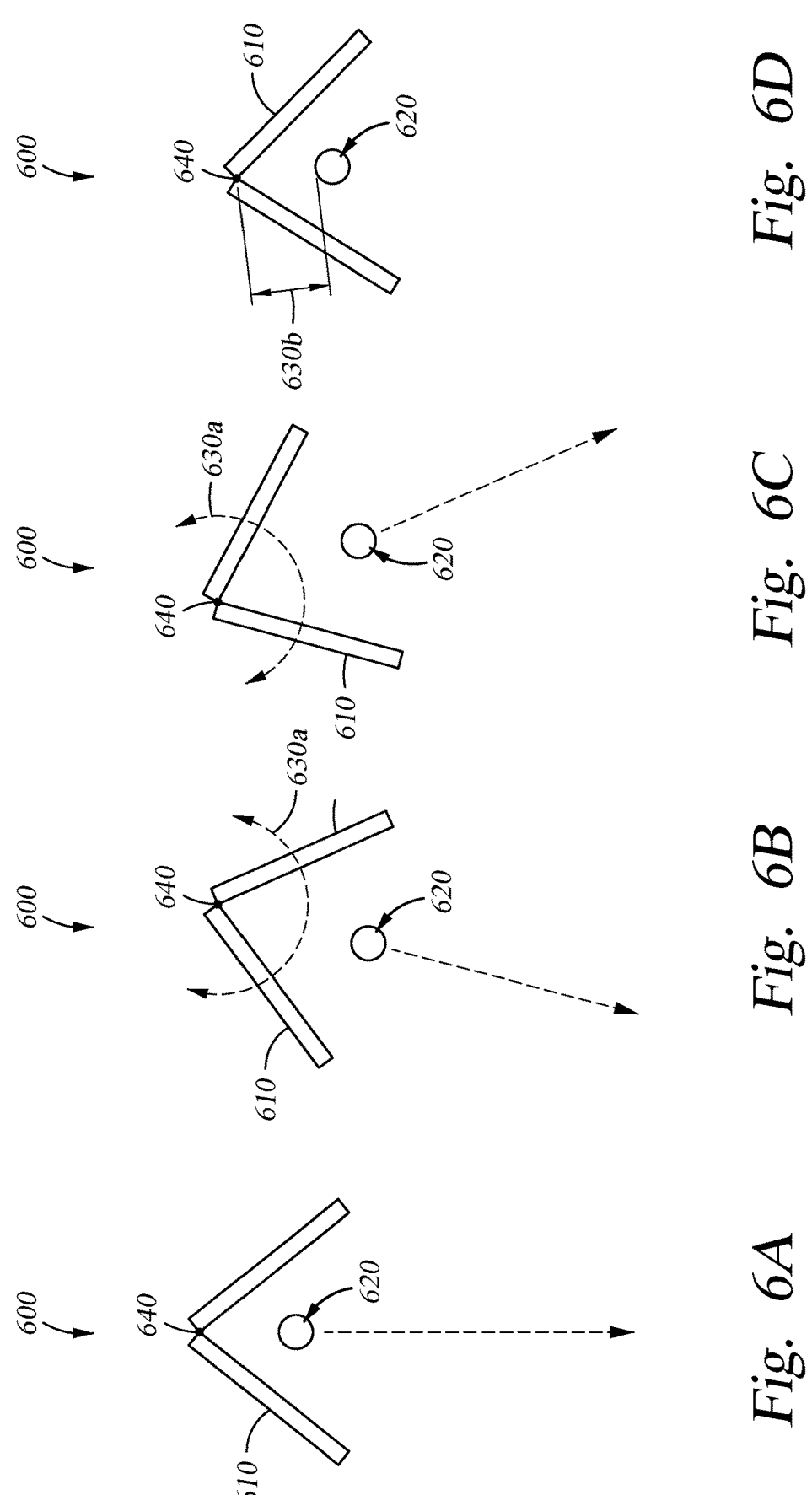
FIGS. 6A-6D illustrate a schematic front view of a reflector assembly according to an embodiment.

FIGS. 6A-6D illustrate a reflector assembly 600. As shown in FIG. 6A, the reflector assembly 600 includes a reflector 610, such as an angled reflector, with a reflective surface to reflect a radiance of a lamp 620 (e.g., upper lamp 108 or lower lamp 110) towards a target (e.g., the substrate 118) at a focal distance and point. The reflector assembly 600 also includes an actuator 640 coupled to a vertex of the angled reflector 610 configured to cause rotational displacement of the angled reflector 610 along a motion path 630a, 630b. Alternatively, the reflector 610 may be a convex reflector or a flat reflector and the actuator 640 may be coupled to a central point on the reflector. The actuator 640 may be a pneumatic actuator 640, a motor, or a combination thereof. As shown in FIGS. 6B and 6C, the actuator 640 may rotate the angled reflector 610 along the motion path 630a, changing the focal point of the radiance of the lamp 620.

Further, the actuator 640 may cause a linear displacement, e.g., increase or decrease a linear distance, of the reflector 610 to the lamp 620 as shown in FIG. 6D by moving the reflector 610 along a linear motion path 630b. The lamp 620 may be stationary or may include a separate actuator 640 that linearly actuates the lamp 620 in concert with the actuator 640 to linearly displace the reflector 610 from the lamp 620.

FIG. 7A shows a lamp head assembly 700, which may be configured for use in the processing chamber 100 in either the upper lamp 108 position or the lower lamp 110 position. The lamp head assembly 700 includes a lamp head body 710 and a plurality of lamps 720 disposed therein. The lamps may be arranged in a pattern around an outer surface of the lamp head body 710 and may be any desired lamps, such as polygon lamps, linear lamps, or small horizontal or vertical lamps.

Figure 7B:
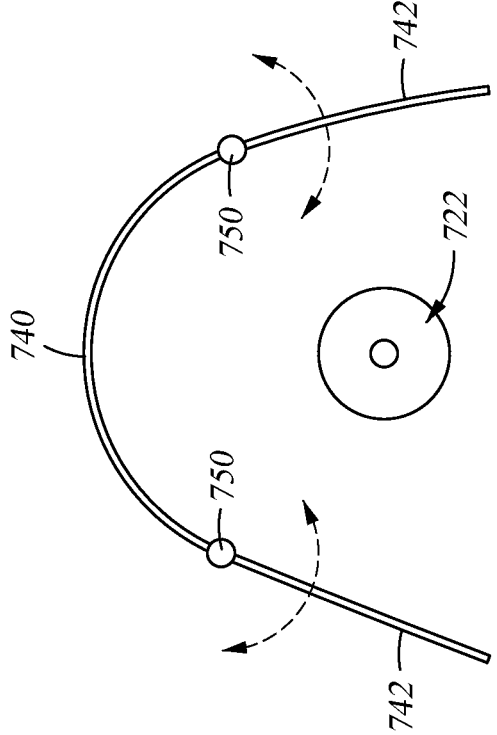
FIG. 7B illustrates a front view of a reflector assembly according to an embodiment.

As shown in FIG. 7B, the reflector assembly 730 may be arranged in a similar manner to the reflector assembly 600 as described in FIGS. 6A-6B. A system of reflector assemblies 730 may face subsets of lamps 722 of the plurality of lamps 720 such that the entirety of the plurality of lamps 720 face the system of reflector assemblies 730. Each of the reflector assemblies 730 may include rotating elements 742 coupled to stationary elements 740 by a plurality of actuators 750 and may be actuated independently of or concurrently with other reflector assemblies 730. The system of reflector assemblies 730 reflect a radiance of each of the subset of lamps 722 towards a substrate (e.g., the substrate 118) at a focal distance and focal point. The system of reflectors may be actuated to adjust the focal distance and focal point of each of the subset of lamps 722 as desired, such as before processing and during processing.

Figure 8A:
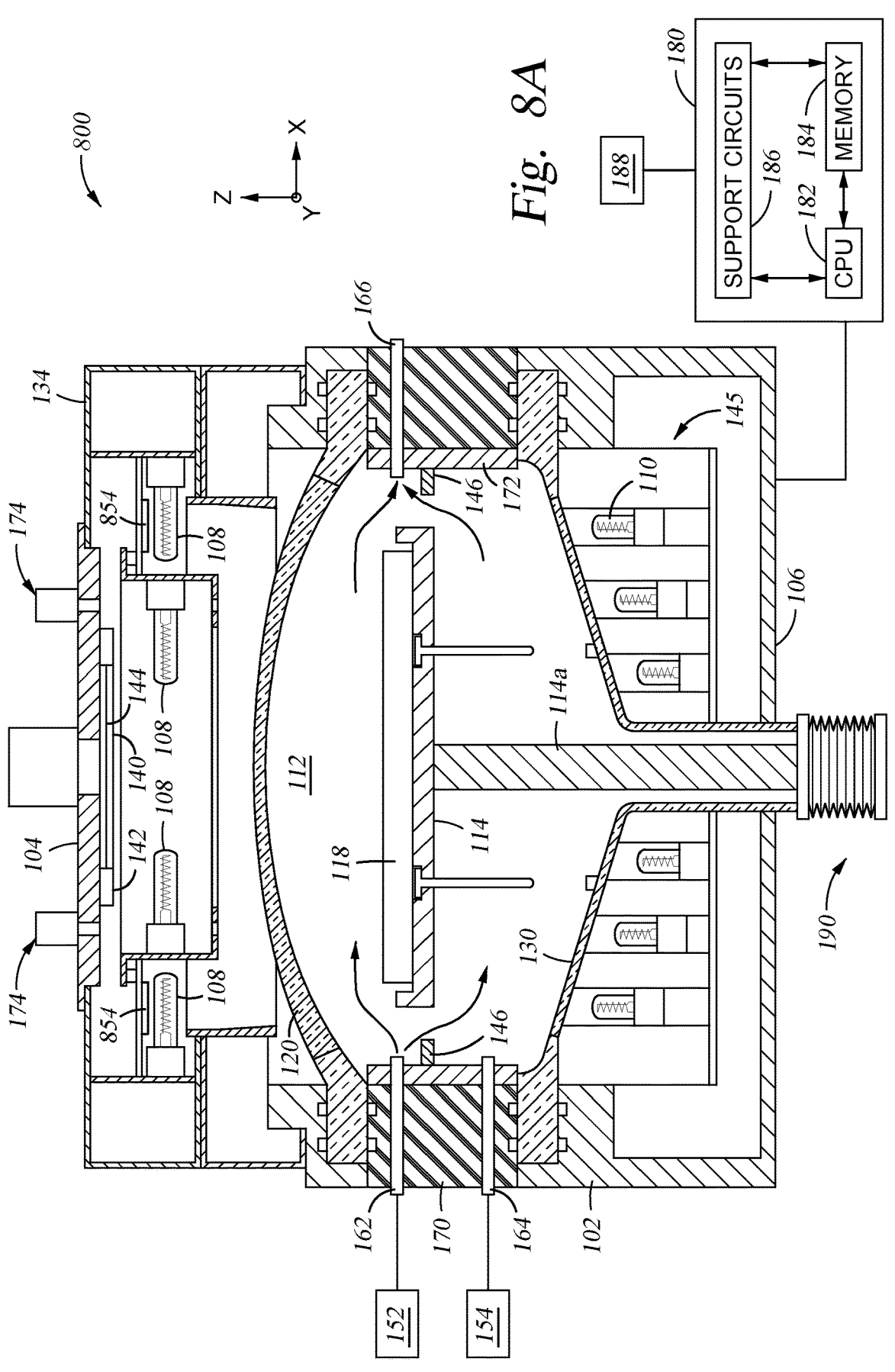
FIG. 8A illustrates a schematic cross-sectional view of a processing chamber, according to an embodiment.

FIG. 8A illustrates a schematic cross-sectional view of a processing chamber 800. The processing chamber 800 is similar to the processing chamber 100 shown in FIG. 1, and thus similar features are denoted with the same reference numbers for clarity.

As shown, a top reflector 840 may be optionally placed outside the upper window 120 to reflect light that is radiating off the substrate 118 back onto the substrate 118. An edge reflector 854 may be placed outside the upper window 820 and above the outermost upper lamps 108. Although not shown, the edge reflector 854 could also be configured about the outermost lower lamps 110.

Figure 8B:
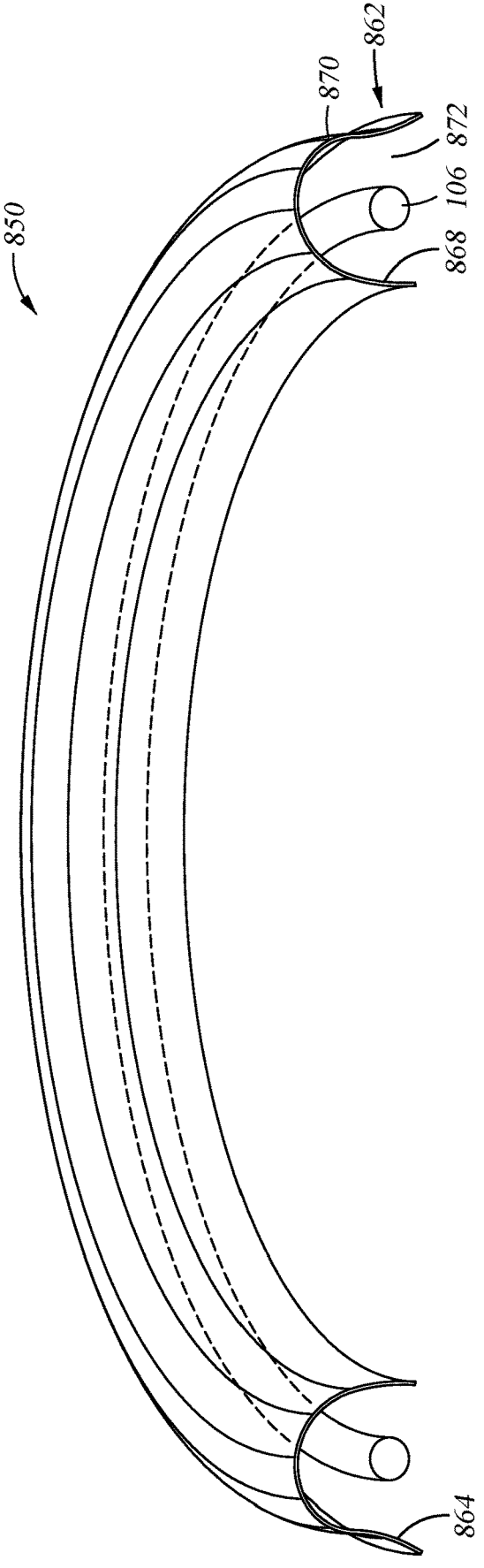
FIG. 8B illustrates an axonometric view of an edge reflector assembly of the processing chamber shown in FIG. 9A, according to an embodiment.

FIG. 8B shows the edge reflector 854 of the processing chamber 800 shown in FIG. 8A. The edge reflector 854 may be configured similarly to the reflector assembly in FIG. 3A. The edge reflector 854 may include a plurality of elements 862 with a first surface 864 having a reflective coating 868 creating a reflector with a reflector profile 872 facing the upper lamp 108. The plurality of elements 862 may be actuated by at least one actuator 870 such that the reflector profile 872 is adjusted as desired, such as before processing or during processing.

Figure 8C:
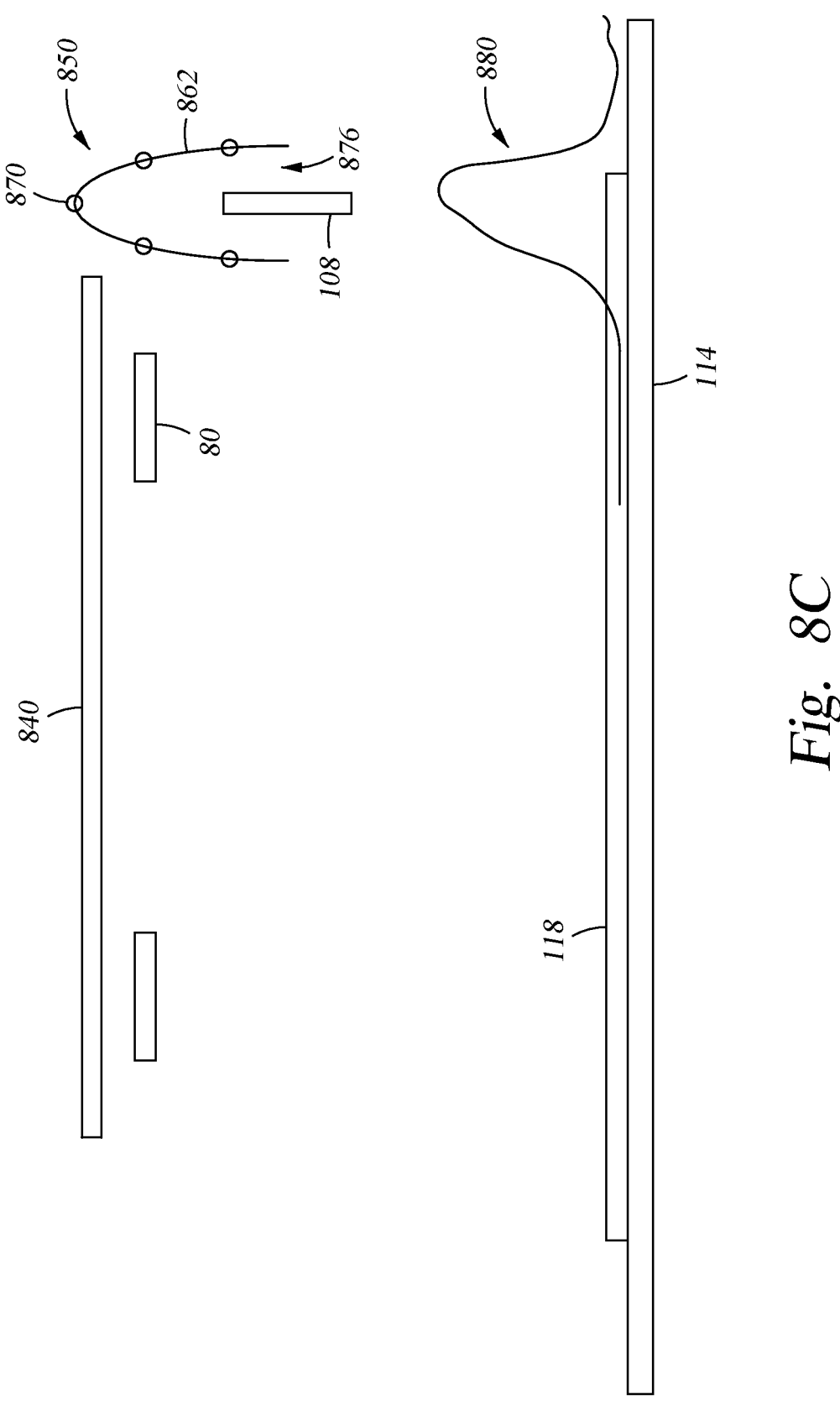
FIG. 8C illustrates a simplified schematic cross-sectional view of a processing chamber, according to an embodiment.

FIG. 8C illustrates a schematic cross-sectional view of a portion of the processing chamber 800 comprising the edge reflector 854 of FIGS. 8A and 8B. The reflector profile 872 of the edge reflector 854 reflects a radiance of the upper lamp 108 toward a portion of the substrate 118 on the susceptor 114. The reflected radiance creates a thermal profile 880 with a thermal intensity over the portion of the substrate 818. In particular, the thermal profile 880 is focused on the outer edge of the substrate 818. Although the top reflector 804 with a top lamp (e.g., centrally located upper lamp 108) may provide a thermal profile 880 over a central area of the substrate 118, the edges of the substrate 118 are often difficult to thermally process in a satisfactory fashion. The edge reflector 854 with the upper lamp 108 along the outer circumference allows controlled and focused thermal processing of the edges of the substrate 118.

Figure 9A:
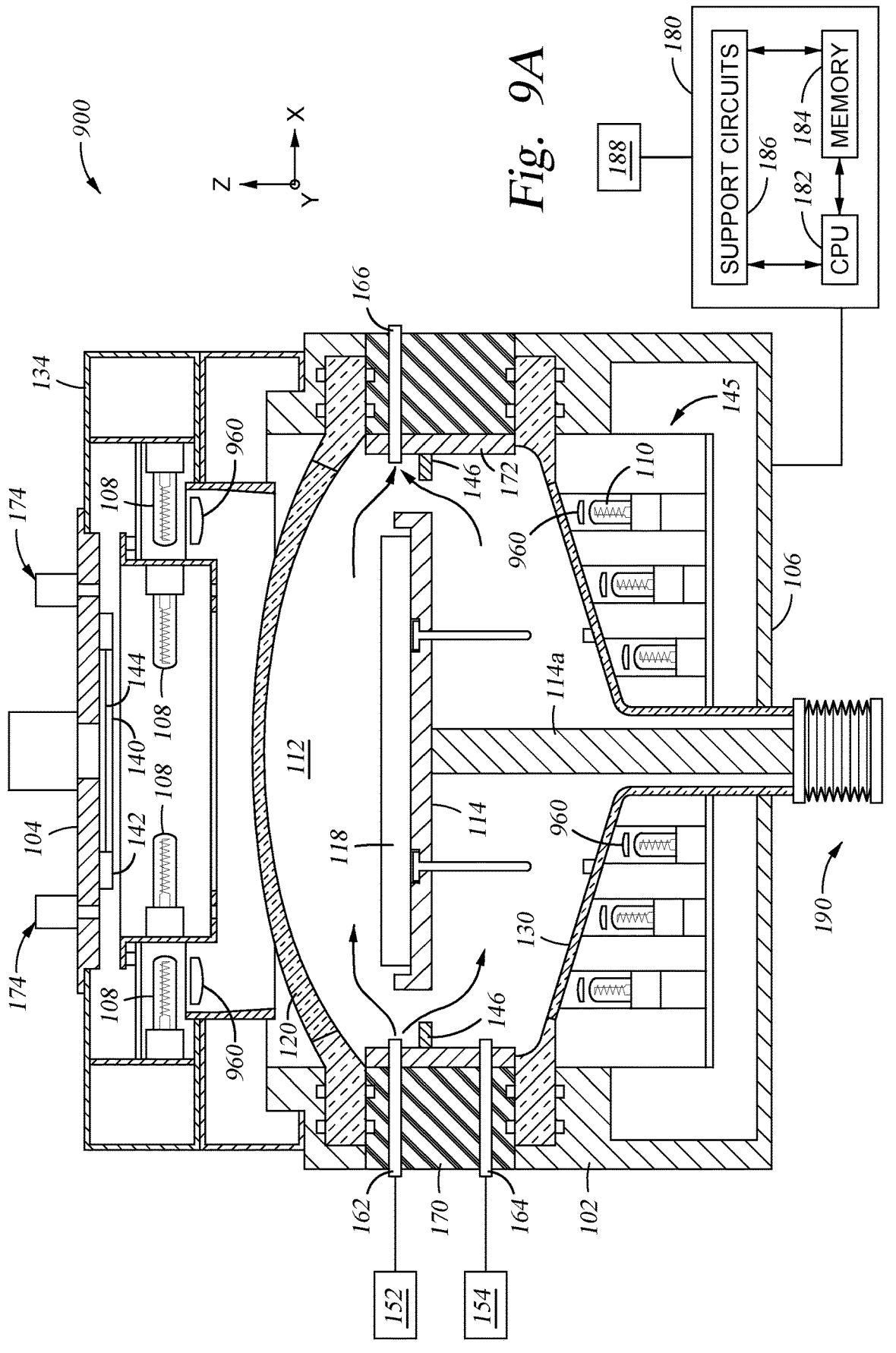
FIG. 9A illustrates a schematic cross-sectional view of a processing chamber, according to an embodiment.

FIG. 9A illustrates a schematic view of a processing chamber 900. The processing chamber 900 is similar to the processing chamber 100 shown in FIG. 1, and thus similar features are denoted with the same reference numbers for clarity. The processing chamber 900 also includes the one or more lower lamps 110 beneath the lower window 130 disposed underneath the substrate 118. At least one lens assembly 960 may be placed between one or more of the upper lamps 108 and the upper window 120. Additionally, the at least one lens assembly 960 may be placed between the substrate 118 and any of the lamps in the processing chamber 900, such as the lower lamps 110 or upper lamps 108.

Figure 9B:
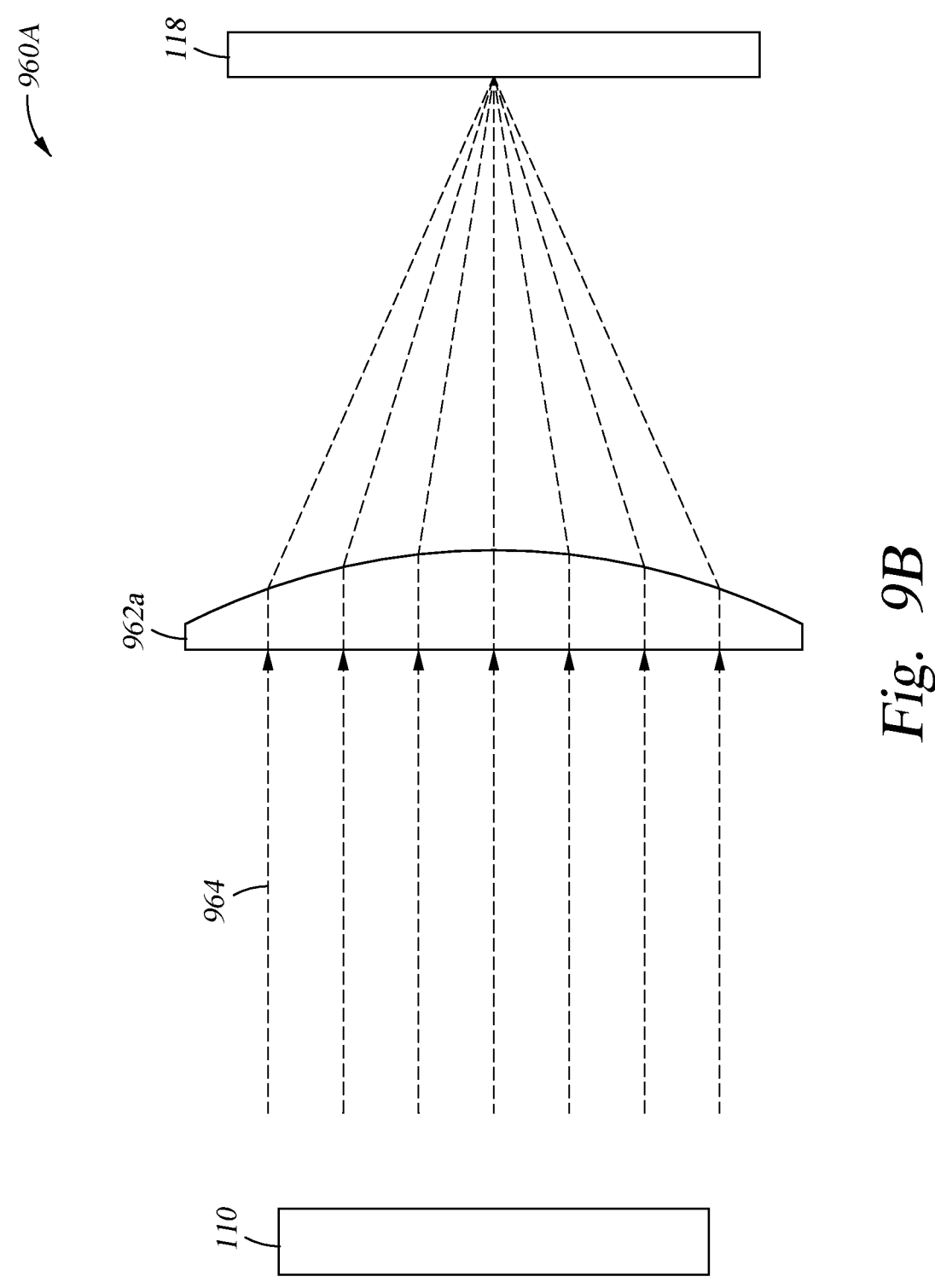
FIG. 9B illustrates a schematic cross-sectional view of a lens assembly of FIG. 9A, according to an embodiment.

FIG. 9B illustrates a schematic cross-sectional view of a lens assembly 960 of FIG. 9A, according to an embodiment. As shown in FIG. 9B, a lens assembly 960a may comprise at least one convex lens 962a disposed between the lamp (e.g., lower lamp 108) and the substrate 118. The lamp (e.g., upper lamp 110) radiates towards the at least one convex lens 962a at a focal distance to create a focal point on the substrate 118. The lens assembly 960a redirects radiance 964 from the lamp (e.g., upper lamp 108) and focuses the radiance 964 at the focal point to produce a desired thermal profile on the substrate 118.

Figure 9C:
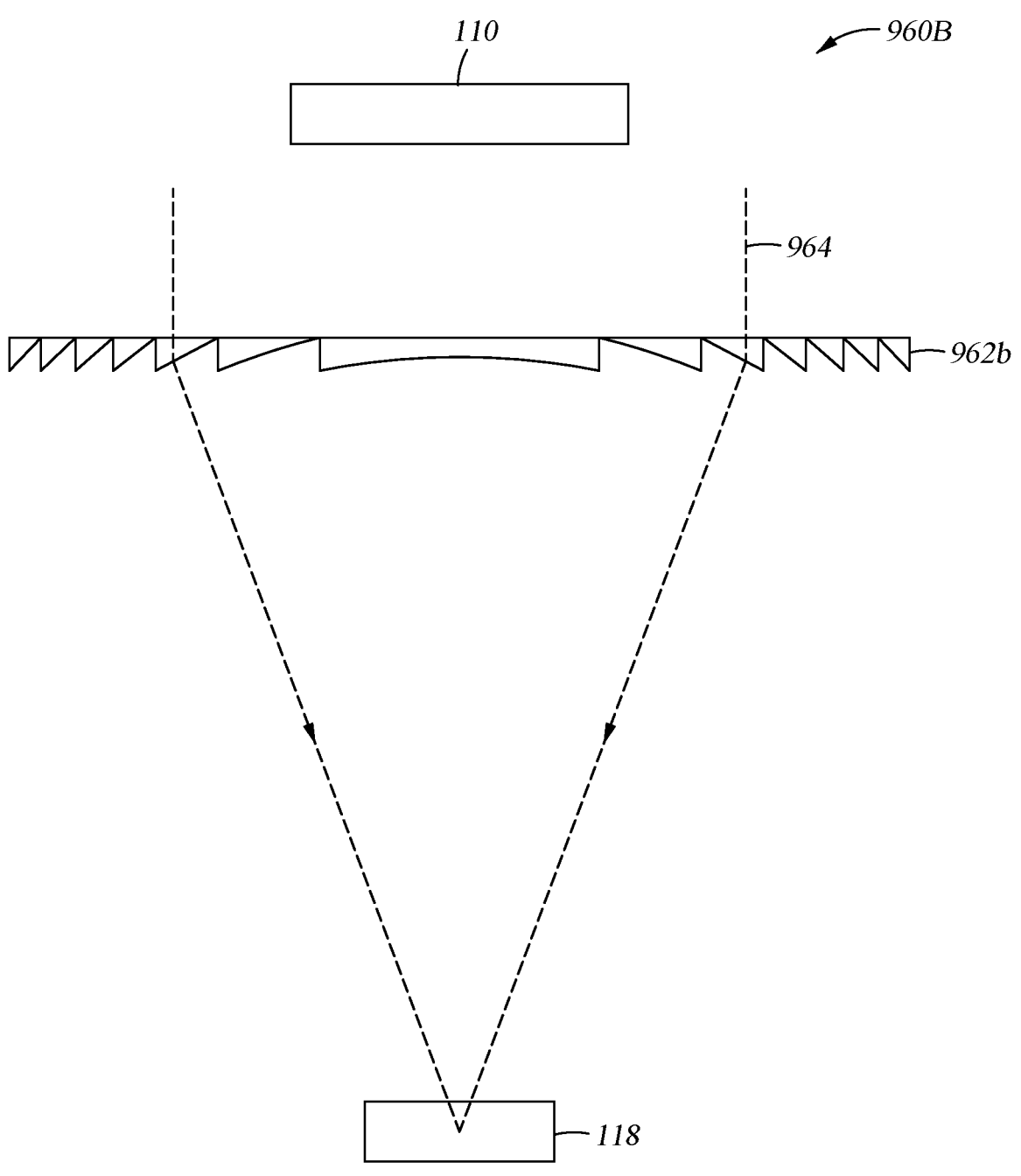
FIG. 9C illustrates a schematic cross-sectional view of a lens assembly of FIG. 9A, according to an embodiment.

FIG. 9C illustrates a schematic cross-sectional view of a lens assembly 960 of FIG. 9A, according to another embodiment. As shown in FIG. 9C, a lens assembly 960b may comprise at least one Fresnel lens 962b with a number of sections wherein a radiance 964 from the lamp (e.g., upper lamp 108) is directed to a focal point through the Fresnel lens 962b. The Fresnel lens 962b may capture more oblique radiance 964 from the lamp (e.g., upper lamp 108) and provide a larger focal distance range than a simple convex lens. The Fresnel lens 962b requires less material to produce and provides a thinner lens profile. Alternatively, the lens assembly 960B may also comprise a Luneburg lens instead of a Fresnel lens. The Luneburg lens comprises a lens with a circular cross-sectional area which has a refractive index that decreases radially from its center point to the outer surface.

Figure 9D:
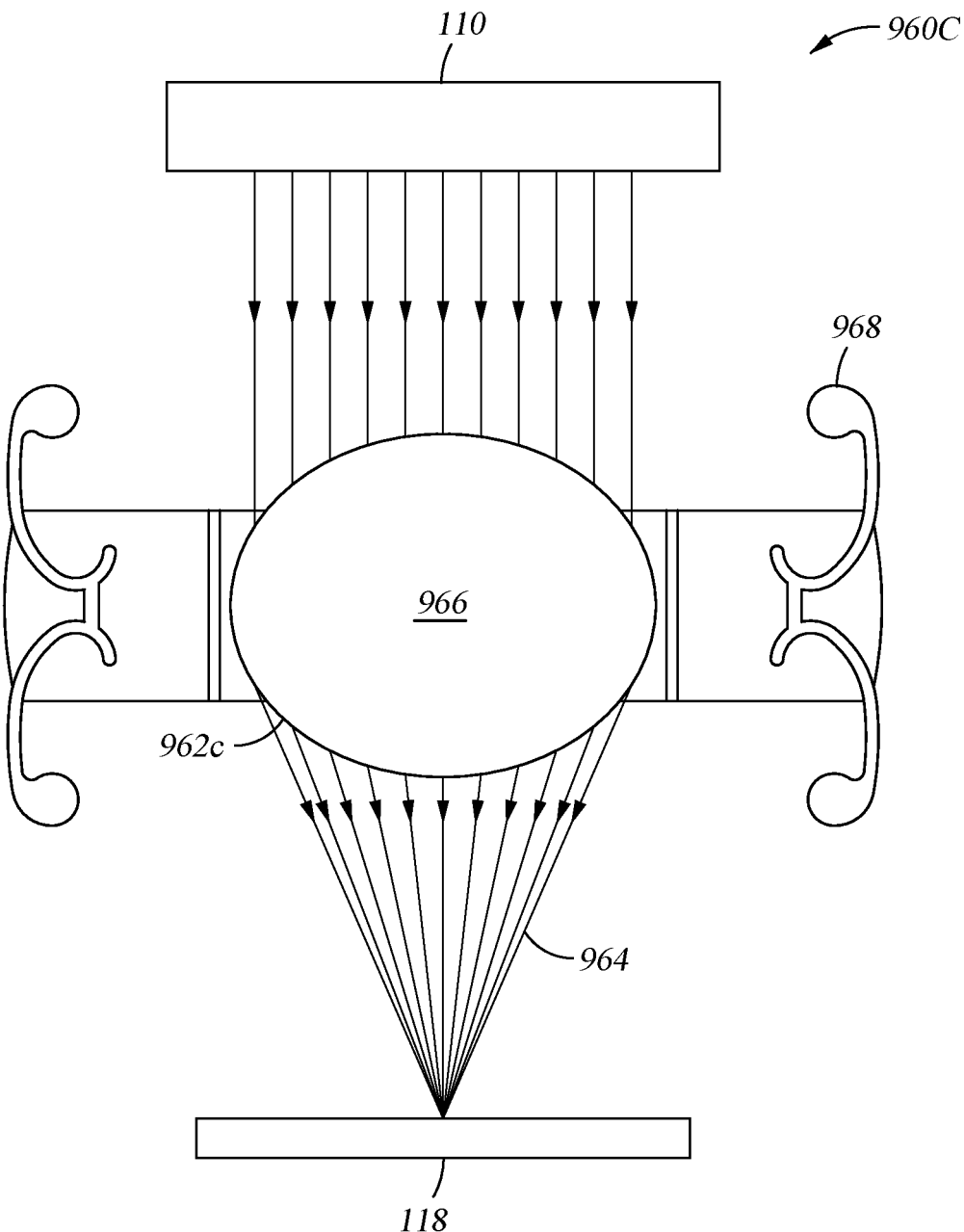
FIG. 9D illustrates a schematic cross-sectional view of a lens assembly of FIG. 9A, according to an embodiment.

FIG. 9D illustrates a schematic cross-sectional view of a lens assembly 960 of FIG. 9A, according to another embodiment. As shown in FIG. 9D, a lens assembly 960c may alternatively comprise an accommodating lens 962c comprising a lens 966 coupled to an actuator 968. The actuator 968 may be a linear actuator (such as a pneumatic actuator), a rotational actuator 968, or a combination thereof. The accommodating lens 962c may be actuated to shorten or lengthen a distance between the lamp (e.g., upper lamp 108) and the lens 966, thus adjusting a focal point on the substrate 118.

FIGS. 9E-10F illustrate schematic cross-sectional views of a lens assembly 960 of FIG. 9A, according to yet another embodiment. As shown in FIGS. 9E-10F, a lens assembly 960d may comprise a fluid-filled lens 962d. The fluid-filled lens 962d includes a fluid-filled cavity 970 bound in part by a deformable polymer membrane 972. Adjusting the volume of the fluid within the cavity 970 deforms the membrane 972 and changes the curvature of the lens 962d. The cavity 970 may be mechanically or electrically deformed, for example, by actuators 974 on two opposing sides of the cavity 970 or by application of a current.

Figure 9E:
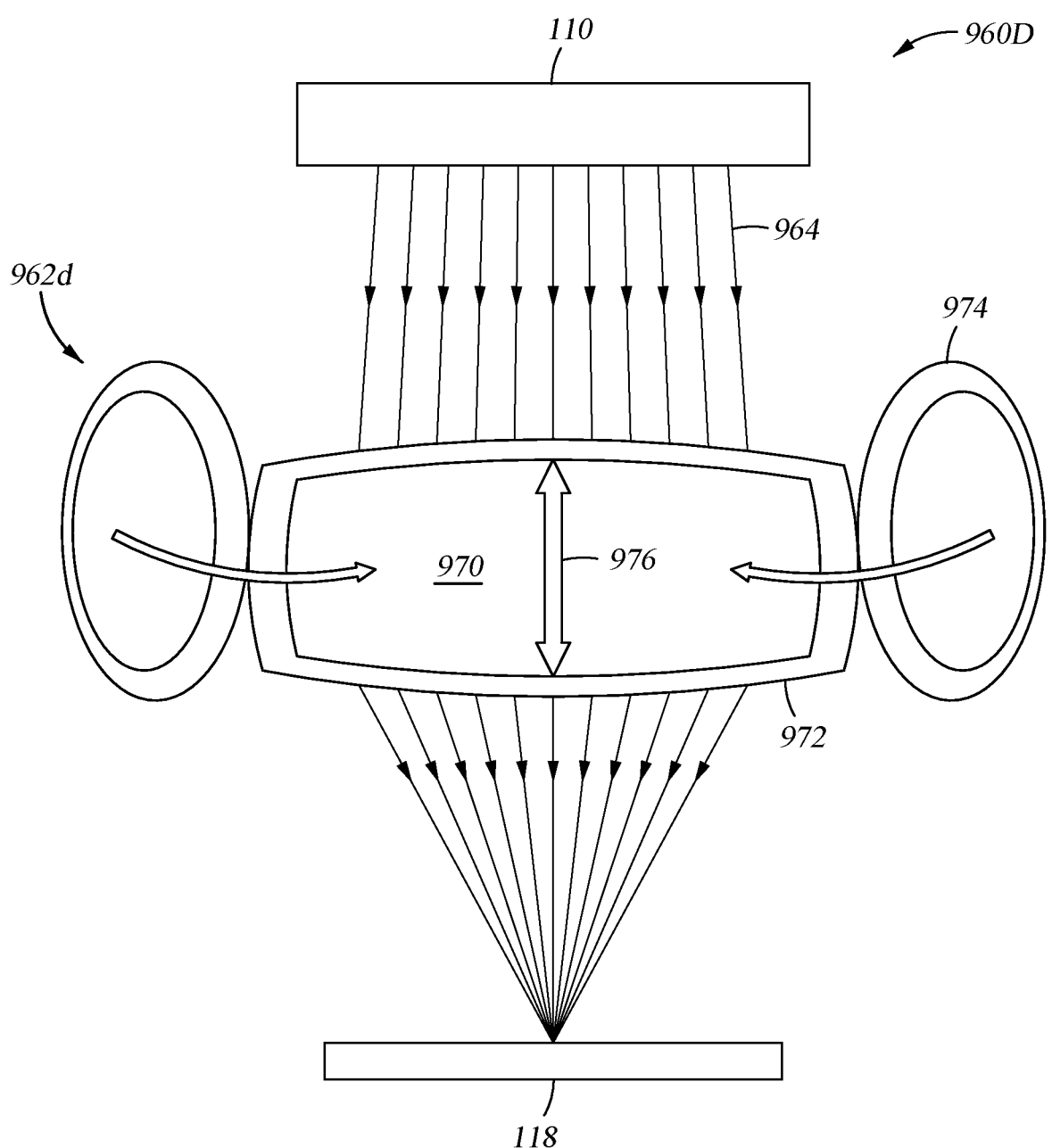
FIGS. 9E-9F illustrate schematic cross-sectional views of a lens assembly of FIG. 9A, according to an embodiment.
Figure 9F:
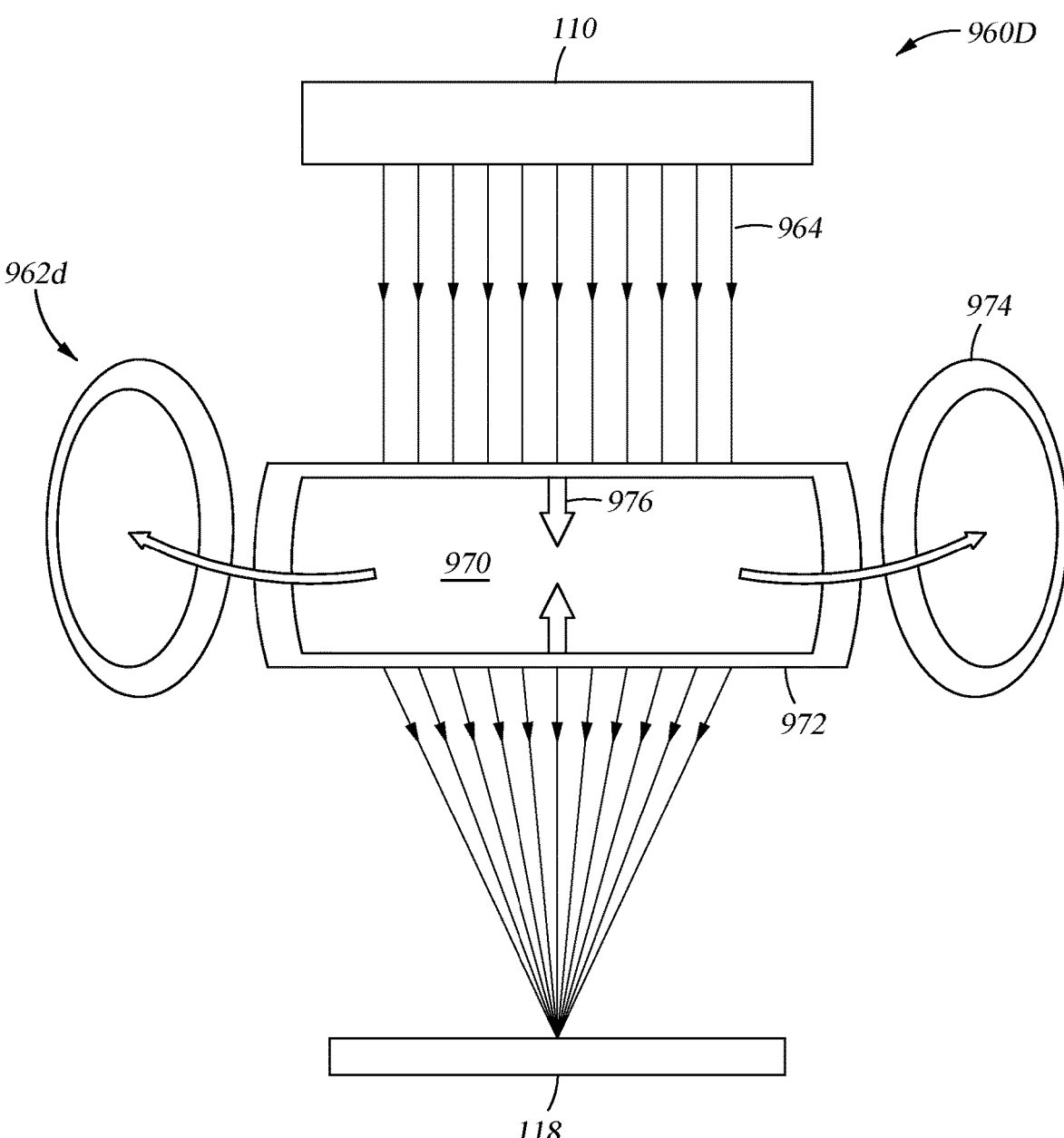

As shown in FIG. 9E, when the actuators 974 compress the polymer membrane 972, the fluid in the fluid-filled cavity 970 compresses axially with the compression applied by the actuators 974. Simultaneously, the fluid in the fluid-filled cavity 970 expands in a motion path 976 perpendicular to the axis of compression of the actuators 974. In FIG. 9F, the actuators 974 decompress the fluid-filled cavity 970, resulting in reduction of the fluid-filled cavity 970 along the motion path 976.

Figure 10A:
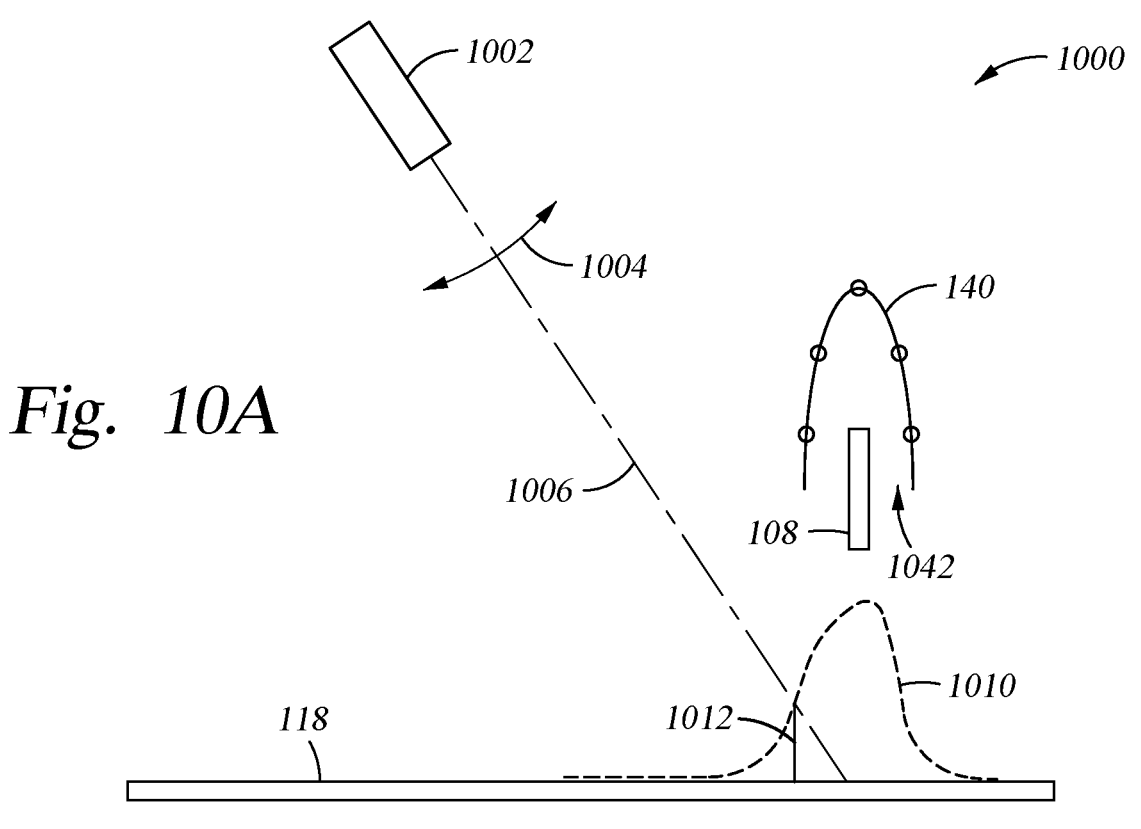
FIGS. 10A-10B illustrate a simplified cross-sectional view of a processing chamber, according to an embodiment.
Figure 10B:
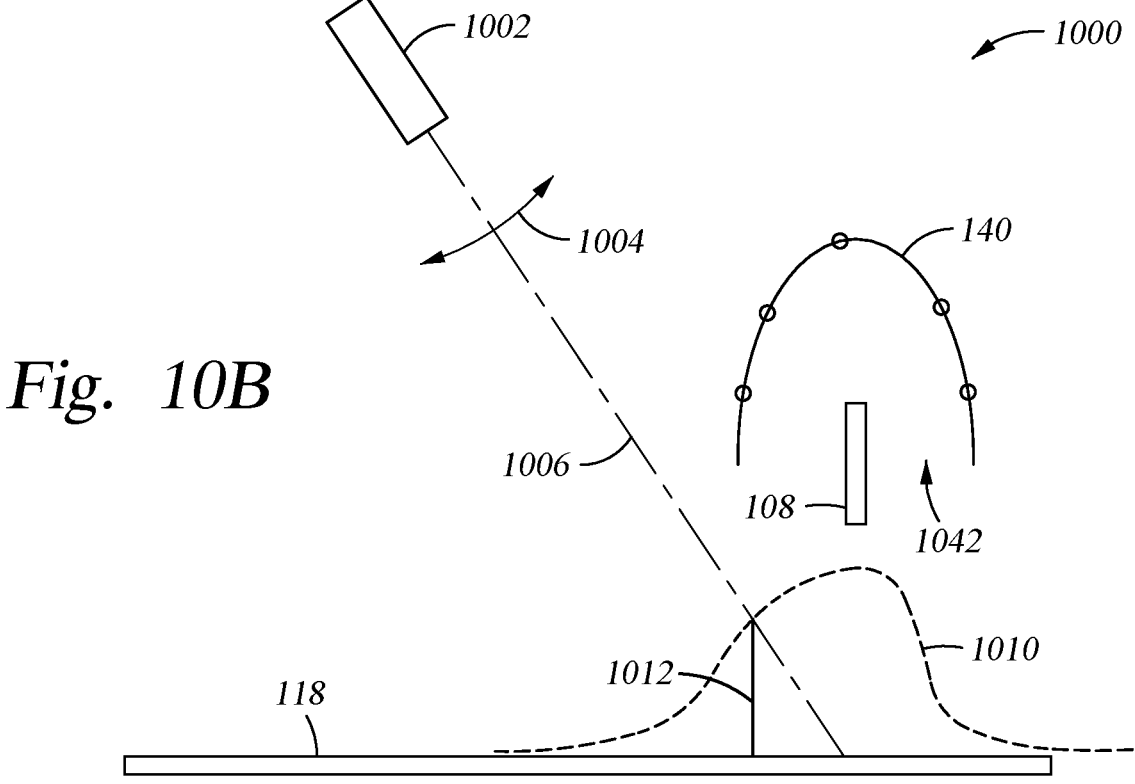

FIGS. 10A-10B illustrate a simplified cross-sectional view of a processing chamber, according to an embodiment. As shown in FIGS. 10A and 10B, a substrate heating system 1000 may include a system of pyrometers 1002 that monitor a thermal profile 1010 of an area of interest on a substrate 118 below (or above) a reflector assembly 140 (e.g., any of the reflector assemblies 300, 400, 500, 600, 700, or 850) and the upper lamp 108 (or the lower lamp 110). The reflector assembly 140 has a reflector profile 1042 and is configured to reflect a radiance of the lamp 108 at a focal distance and focal point. The system of pyrometers 1002 may be adjusted to measure a different area of interest on the substrate 118 as desired by rotating or displacing the pyrometers 1002 along a path 1004. The system of pyrometers 1002 emit a beam 1006 to measure a thermal intensity 1012 of a thermal profile 1010 of the area of interest. Upon receiving input either through a user input or through feedback instructions from a controller (e.g., controller 160) as described in FIGS. 10C and 10D regarding desired thermal parameters, the reflector assembly 140 may be actuated to change the reflector profile 1042, thereby changing the focal point of the radiance of the lamp 108. For example, the reflector profile 1042 may be broadened to broaden the thermal profile 1010 of the area of interest on the substrate 118.

Figure 10C:
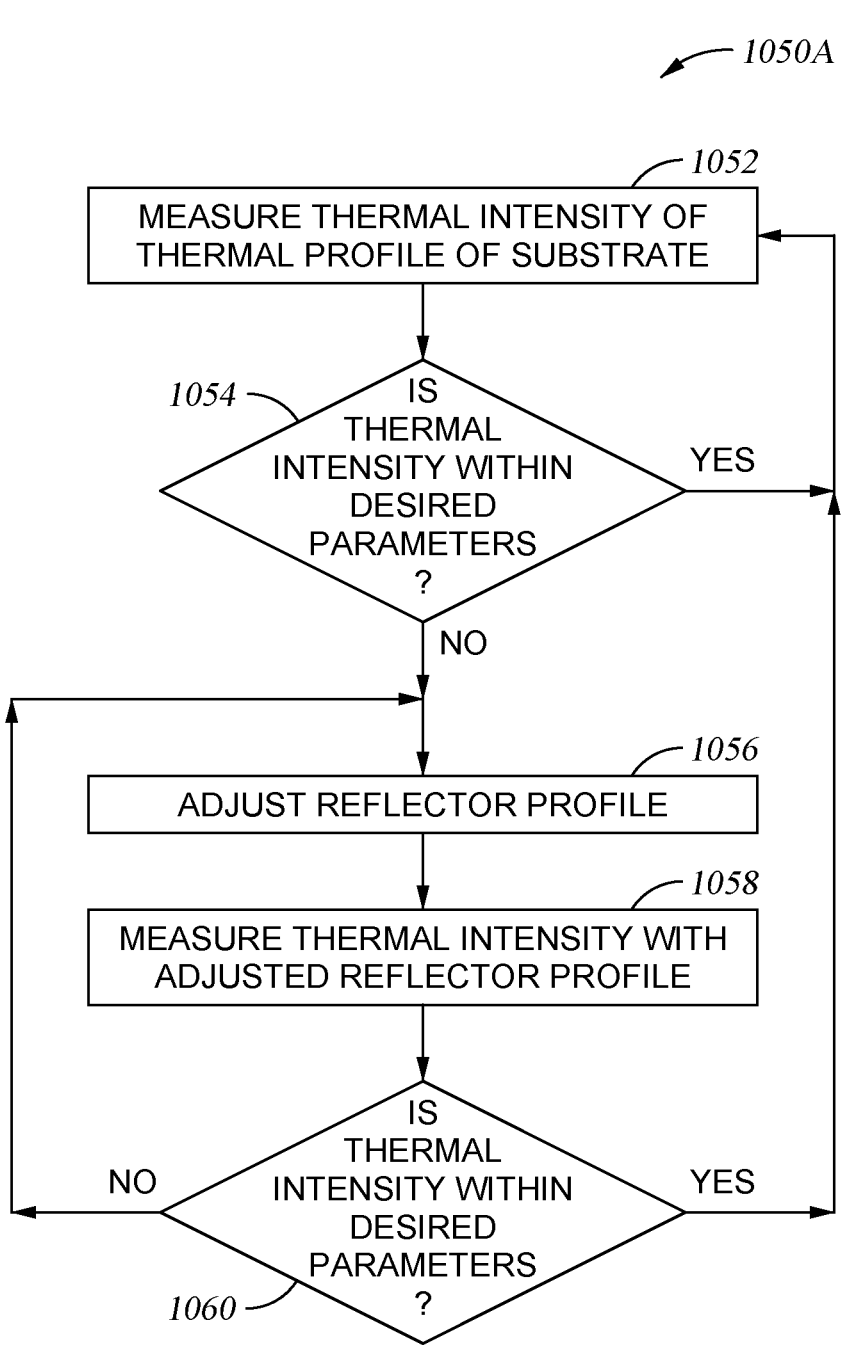
FIG. 10C illustrates a method for closed-loop operation of the reflector assembly, according to one embodiment.
Figure 10D:
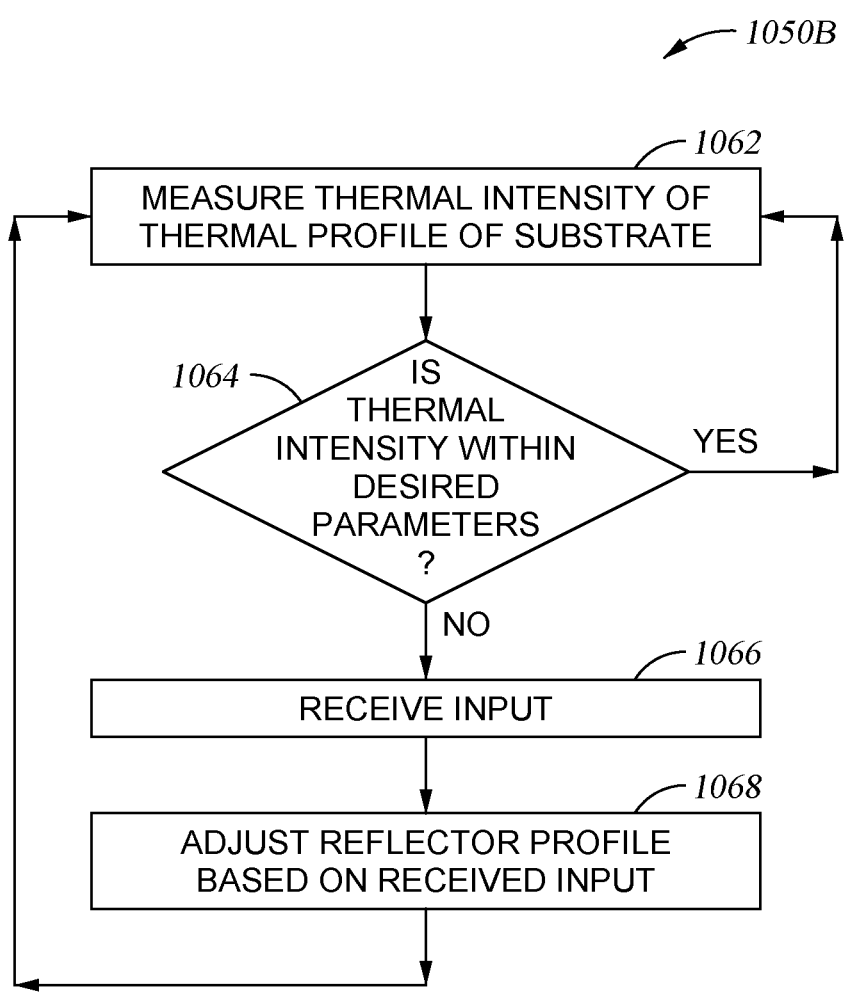
FIG. 10D a method for open-loop operation of the reflector assembly, according to one embodiment.

FIG. 10C illustrates a method 1050A for closed-loop operation of the reflector assembly 140 further illustrated in FIGS. 10C and 10D. The method 1050A begins at block 1052 by measuring a thermal profile 1010 of an area of interest of the substrate 118 using the system of pyrometers 1002. The system of pyrometers 1002 may include the plurality of pyrometers 1002 measuring different portions of the substrate 118. One or more of the pyrometers 1002 may be slaved to a primary pyrometer which monitors the primary area of interest. The system of pyrometers 1002 monitor the thermal profile 1010 of the substrate 118.

The system of pyrometers 1002 may be coupled to a controller (e.g., the controller 160) and the reflector assembly 140, such as the reflector assembly 300, reflector assembly 400, reflector assembly 500, reflector assembly 600, reflector assembly 700, or reflector assembly 850 or a lens assembly (e.g., lens assembly 1060a-1060d). At block 1054, based on input from the system of pyrometers 1002, the controller determines whether the thermal intensity 1012 of the thermal profile 1010 is outside of desired parameters (e.g., too low or too high). At block 1056, the reflector profile 1042 is adjusted. The controller coupled to the system of pyrometers 1002 and the reflector assembly 1040 may actuate the reflector assembly 1040 to adjust the reflector profile 1042. In a lens assembly (e.g., lens assembly 1060a-1060d), the controller may actuate the lens, such as linearly displacing a convex or Fresnel lens or changing the volume of a cavity of a fluid-filled lens, to adjust a focal length and focal point of the lens to a pre-determined focal length.

At block 1058, the system of pyrometers 1002 may then continue to monitor the thermal profile 1010 of the area interest of the substrate 118. If the thermal intensity 1012 again falls outside of desired parameters as determined in block 1060, the controller may then return to block 1056 and readjust the reflector profile 1042 by actuating the reflector assembly 140 as needed.

FIG. 10D illustrates a method 1050B for open-loop operation of the reflector assembly 140. Similar to method 1050A, method 1050B may begin at block 1062 by using a system of pyrometers 1002 to measure different portions of a substrate 118. The pyrometers 1002 may provide real-time measurements to a user interface (e.g., user interface 188) coupled to a controller (e.g., controller 180). The controller (e.g., controller 180) may receive input to actuate a reflector assembly 140 to match a pre-determined reflector profile 1042 stored in a memory (e.g., memory 184). The pre-determined reflector profile 1042 may be based upon a recipe for thermal processing or substrate type and may be one of several pre-determined reflector profiles 1042 wherein the position of each of the plurality of elements is actuated to a desired position to achieve a desired focal length and direction. Optionally, the system of pyrometers 1002 may provide a measurement of thermal intensity 1012 of an area of interest of the substrate 118. The user interface may then receive input to adjust the reflector assembly 140 to a different pre-determined reflector profile 1042. Alternatively, the user interface may receive input to adjust the reflector profile 1042 to parameters different from pre-determined reflector profiles 1042.

Figure 11A:
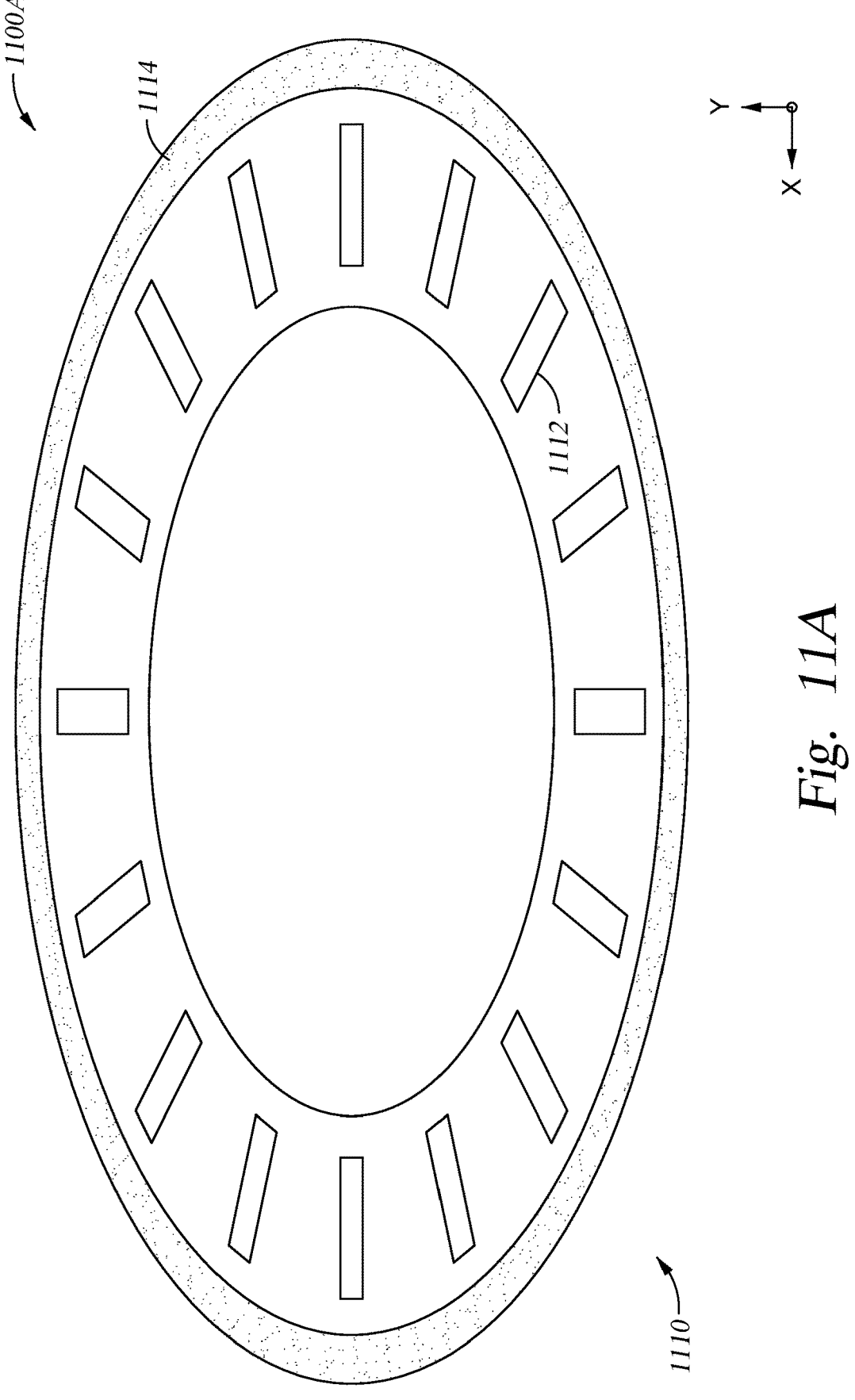
FIG. 11A illustrates a top view of a lamp head assembly, according to an embodiment.

FIG. 11A illustrates a top view of a lamp head 1100A having a plurality of lamps 1110 (e.g., either the upper lamps 108 or the lower lamps 110 of FIG. 1) disposed therein. The plurality of lamps 1110 comprise of at least two lamps operating at two different frequency bands (e.g., at least one infrared (IR) lamp and at least one ultraviolet (UV) lamp). The at least one IR lamp 1112 may operate in the IR wavelength band, i.e., at a wavelength between about 750 nm to about 1300 nm. The at least one UV lamp 1114 may operate in the UV wavelength range, i.e., at a wavelength between about 100 nm and about 400 nm.

The at least one UV lamp 1114 may also be different shapes such as a circular UV lamp 1114 on the perimeter of the lamp head 1100A. The at least one IR lamp 1112 may be an array of IR lamps 1112 disposed within the circular UV lamp 1114. Using lamps operating at different frequencies allows for pre-activation of gaseous precursors used for epitaxy deposition, such as silicon-containing composition like silane ($SiH_4$). The pre-activation allows the silicon-containing composition to react and form a deposition with less thermal energy. Additionally, using UV lamps improves the efficiency of pre-cleaning in a bake out step.

Figure 11B:
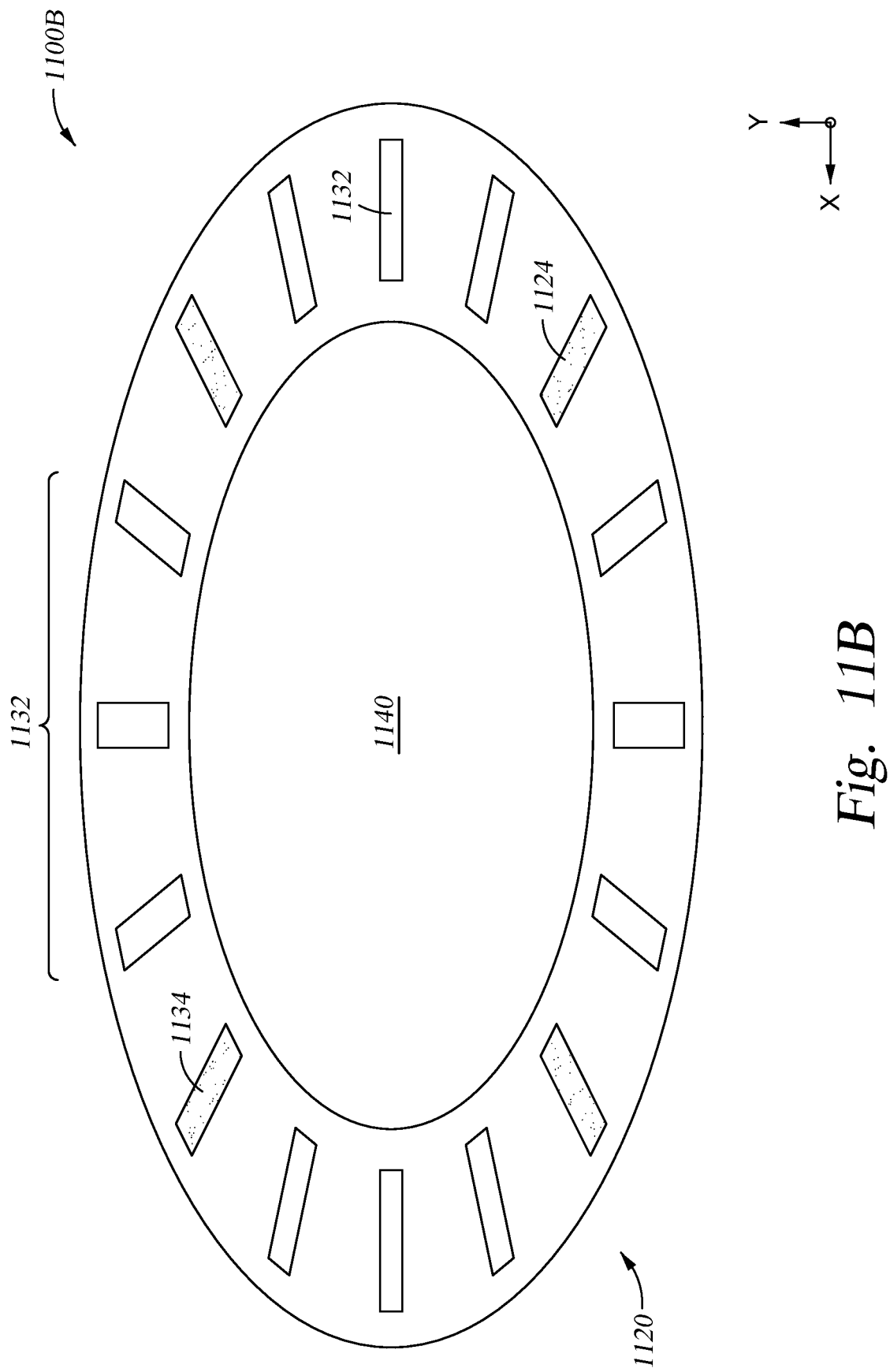
FIG. 11B illustrates a top view of a lamp head assembly, according to an embodiment.

FIG. 11B illustrates a top view of a lamp head 1100B with a plurality of lamps 1120 (e.g., either the upper lamps 108 or the lower lamps 110 of FIG. 1) made of a plurality of IR lamps 1122 and a plurality of UV lamps 1124. The plurality of IR lamps 1122 may be an IR lamp array 1154 interspersed between a UV lamp array 1134. As shown in FIG. 11B, the IR lamp array 1112 may be between the UV lamp array 1134. The IR lamp array 1154 may include any desired number of elements, such as three, interspersed between any number of elements of the UV lamp array 1134, such as one. The IR lamp array 1154 and the UV lamp array 1134 may form a pattern that is repeated across a radiating surface 1140 of the lamp head 1100B.

When introducing elements of the present disclosure or exemplary aspects or embodiment(s) thereof, the articles "a," "an," "the" and "said" are intended to mean that there are one or more of the elements.

The terms "comprising," "including" and "having" are intended to be inclusive and mean that there may be additional elements.

The term "coupled" is used herein to refer to the direct or indirect coupling between two objects. For example, if object A physically touches object B and object B touches object C, the objects A and C may still be considered coupled to one another—even if objects A and C do not directly physically touch each other. For instance, a first object may be coupled to a second object even though the first object is never directly in physical contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A substrate processing chamber, comprising:
a chamber body comprising a lid, a floor, and a processing volume disposed between the lid and the floor;
an upper window disposed between the lid and the processing volume;
a lower window disposed between the floor and the processing volume;
a substrate support assembly disposed in the processing volume;
a lamp head disposed either between the upper window and the lid or between the lower window and the floor;
at least one lamp disposed within the lamp head;
a lens disposed between the lamp head and the processing volume; and
an actuation mechanism configured to shorten or lengthen a distance between the lamp head and the lens.

2. The substrate processing chamber of claim 1, wherein the lens is a convex lens.

3. The substrate processing chamber of claim 1, wherein the lens is a Luneburg lens.

4. The substrate processing chamber of claim 1, wherein the lens is a Fresnel lens.

5. The substrate processing chamber of claim 1, wherein the lens is a fluid-filled lens.

6. The substrate processing chamber of claim 1, further comprising an actuation mechanism coupled to the lens configured to actuate the lens relative to the lamp head.

7. The substrate processing chamber of claim 1, wherein the lens is further configured to focus a radiance from a lamp towards an area of a substrate disposed on the substrate support assembly.

8. The substrate processing chamber of claim 7, wherein the lens is actuated by an actuation mechanism to focus the radiance from the lamp towards the area of the substrate.

9. The substrate processing chamber of claim 1, wherein the actuation mechanism is configured to shorten or lengthen a distance between the lens and the upper window.

10. The substrate processing chamber of claim 1, wherein the actuation mechanism is configured to shorten or lengthen a distance between the lens and the lower window.

11. A substrate processing chamber, comprising:
a chamber body comprising a lid, a floor, and a processing volume disposed between the lid and the floor;
an upper window disposed between the lid and the processing volume;
a lower window disposed between the floor and the processing volume;
a substrate support assembly disposed in the processing volume;
a lamp head disposed between the lower window and the floor or between the upper window and the lid;
a plurality of lamps disposed within the lamp head, the plurality of lamps comprising:
at least one first lamp operating at a first wavelength; and
at least one second lamp operating at a second wavelength different than the first wavelength
a lens disposed between the lamp head and the lower window or between the lamp head and the upper window; and
an actuation mechanism configured to shorten or lengthen a distance between the lamp head and the lens.

12. The substrate processing chamber of claim 11, wherein the at least one first lamp comprises an array of first lamps and the at least one second lamp comprises an array of second lamps.

13. The substrate processing chamber of claim 12, wherein the array of first lamps is interspersed between the array of second lamps.

14. The substrate processing chamber of claim 12, wherein the array of first lamps and the array of second lamps form a pattern across a radiating surface of the lamp head.

15. The substrate processing chamber of claim 11, wherein the at least one second lamp is a circular lamp disposed along a perimeter of the lamp head.

16. The substrate processing chamber of claim 11, wherein the first wavelength is between 750 nm and 1300 nm.

17. The substrate processing chamber of claim 11, wherein the second wavelength is between 100 nm and 400 nm.

18. A method of heating a substrate, comprising:

measuring a thermal intensity of a thermal profile, using a system of pyrometers, of an area of a substrate disposed on a substrate support proximate a lamp and a lens, the lens disposed between the lamp and the substrate support;

determining if the thermal intensity is outside of desired parameters; and in response to the thermal intensity being outside of desired parameters, adjusting a focal length of a lens assembly using an actuation mechanism coupled to the lens assembly, wherein the actuation mechanism is configured to shorten or lengthen a distance between the lamp and the lens.

19. The method of claim 18, in response to adjusting the focal length, measuring the thermal intensity and determining if the thermal intensity is within desired parameters.

20. The method of claim 18, wherein adjusting the focal length comprises receiving input from a user interface; and in response to receiving the input, adjusting the focal length based on the input.

21. The method of claim 18, wherein adjusting the focal length comprises receiving instructions from a controller coupled to the actuation mechanism and the system of pyrometers to adjust to a pre-determined focal length.

22. The method of claim 18, further comprising:

prior to measuring a thermal intensity of a thermal profile, placing a substrate on a substrate support in a processing chamber, wherein the processing chamber comprises a lamp head; and heating the substrate using the lamp head, wherein the lamp head comprises at least one first lamp operating at a first frequency and at least one second lamp operating at a second frequency.

* * * * *